(12) United States Patent
Uzoh et al.

(10) Patent No.: US 12,272,677 B2
(45) Date of Patent: *Apr. 8, 2025

(54) DIRECT BONDED STACK STRUCTURES FOR INCREASED RELIABILITY AND IMPROVED YIELD IN MICROELECTRONICS

(71) Applicant: ADEIA SEMICONDUCTOR BONDING TECHNOLOGIES INC., San Jose, CA (US)

(72) Inventors: Cyprian Emeka Uzoh, San Jose, CA (US); Rajesh Katkar, Milpitas, CA (US); Thomas Workman, San Jose, CA (US); Guilian Gao, San Jose, CA (US); Gaius Gillman Fountain, Jr., Youngsville, NC (US); Laura Wills Mirkarimi, Sunol, CA (US); Belgacem Haba, Saratoga, CA (US); Gabriel Z. Guevara, San Jose, CA (US); Joy Watanabe, Campbell, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/589,231

(22) Filed: Feb. 27, 2024

(65) Prior Publication Data
US 2024/0203948 A1    Jun. 20, 2024

Related U.S. Application Data

(63) Continuation of application No. 17/681,563, filed on Feb. 25, 2022, which is a continuation of application (Continued)

(51) Int. Cl.
*H01L 21/56* (2006.01)
*H01L 23/00* (2006.01)
(Continued)

(52) U.S. Cl.
CPC ........ *H01L 25/0657* (2013.01); *H01L 21/561* (2013.01); *H01L 23/3121* (2013.01);
(Continued)

(58) Field of Classification Search
CPC ............ H01L 25/0657; H01L 23/3121; H01L 21/561; H01L 24/97; H01L 2224/0401; H01L 2924/3511; H01L 2924/35121
(Continued)

(56) References Cited

U.S. PATENT DOCUMENTS 4,998,665 A    3/1991  Hayashi
5,019,673 A    5/1991  Juskey et al.
(Continued)

FOREIGN PATENT DOCUMENTS

CN    103681646    3/2014
CN    107527885    12/2017
(Continued)

OTHER PUBLICATIONS

"Die-to-Wafer Fusion and Hybrid Bonding," EV Group, https://www.evgroup.com/technologies/die-to-wafer-fusion-and-hybrid-bonding/, printed Sep. 21, 2022, 8 pages.
(Continued)

*Primary Examiner* — Vu A Vu
(74) *Attorney, Agent, or Firm* — Knobbe, Martens, Olson & Bear, LLP

(57) ABSTRACT

Direct bonded stack structures for increased reliability and improved yields in microelectronics are provided. Structural features and stack configurations are provided for memory modules and 3DICs to reduce defects in vertically stacked
(Continued)

dies. Example processes alleviate warpage stresses between a thicker top die and direct bonded dies beneath it, for example. An etched surface on the top die may relieve warpage stresses. An example stack may include a compliant layer between dies. Another stack configuration replaces the top die with a layer of molding material to circumvent warpage stresses. An array of cavities on a bonding surface can alleviate stress forces. One or more stress balancing layers may also be created on a side of the top die or between other dies to alleviate or counter warpage. Rounding of edges can prevent stresses and pressure forces from being destructively transmitted through die and substrate layers. These measures may be applied together or in combinations in a single package.

21 Claims, 23 Drawing Sheets

Related U.S. Application Data

No. 16/911,360, filed on Jun. 24, 2020, now Pat. No. 11,296,053.

(60) Provisional application No. 62/866,965, filed on Jun. 26, 2019.

(51) Int. Cl.
*H01L 23/31* (2006.01)
*H01L 25/065* (2023.01)

(52) U.S. Cl.
CPC ...... *H01L 24/97* (2013.01); *H01L 2224/0401* (2013.01); *H01L 2924/3511* (2013.01); *H01L 2924/35121* (2013.01)

(58) Field of Classification Search
USPC ........................................................ 257/678
See application file for complete search history.

(56) References Cited

U.S. PATENT DOCUMENTS

| | | |
|---|---|---|
| 5,051,802 A | 9/1991 | Prost et al. |
| 5,087,585 A | 2/1992 | Hayashi |
| 5,322,593 A | 6/1994 | Hasegawa et al. |
| 5,729,896 A | 3/1998 | Dalal et al. |
| 5,753,536 A | 5/1998 | Sugiyama et al. |
| 5,771,555 A | 6/1998 | Eda et al. |
| 5,854,507 A | 12/1998 | Miremadi et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,049,124 A | 4/2000 | Raiser et al. |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee |
| 6,410,983 B1 | 6/2002 | Moriizumi et al. |
| 6,423,640 B1 | 7/2002 | Lee et al. |
| 6,465,892 B1 | 10/2002 | Suga |
| 6,500,694 B1 | 12/2002 | Enquist |
| 6,582,991 B1 | 6/2003 | Maeda et al. |
| 6,686,588 B1 | 2/2004 | Webster et al. |
| 6,713,857 B1 | 3/2004 | Tsai |
| 6,768,208 B2 | 7/2004 | Lin et al. |
| 6,782,610 B1 | 8/2004 | Iijima et al. |
| 6,867,073 B1 | 3/2005 | Enquist |
| 6,887,769 B2 | 5/2005 | Kellar et al. |
| 6,908,027 B2 | 6/2005 | Tolchinsky et al. |
| 6,962,835 B2 | 11/2005 | Tong et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,262,492 B2 | 8/2007 | Pieda et al. |
| 7,319,197 B2 | 1/2008 | Oggioni et al. |
| 7,354,798 B2 | 4/2008 | Pogge et al. |
| 7,385,283 B2 | 6/2008 | Wu et al. |
| 7,554,203 B2 | 6/2009 | Zhou et al. |
| 7,566,634 B2 | 7/2009 | Beyne et al. |
| 7,582,971 B2 | 9/2009 | Kameyama et al. |
| 7,589,409 B2 | 9/2009 | Gibson et al. |
| 7,663,231 B2 | 2/2010 | Chang et al. |
| 7,750,488 B2 | 7/2010 | Patti et al. |
| 7,759,751 B2 | 7/2010 | Ono |
| 7,781,309 B2 | 8/2010 | Morita et al. |
| 7,786,572 B2 | 8/2010 | Chen |
| 7,790,578 B2 | 9/2010 | Furui |
| 7,803,693 B2 | 9/2010 | Trezza |
| 7,816,235 B2 | 10/2010 | Chan et al. |
| 7,816,856 B2 | 10/2010 | Cok et al. |
| 7,843,052 B1 | 11/2010 | Yoo et al. |
| 7,897,481 B2 | 3/2011 | Chiou et al. |
| 7,932,616 B2 | 4/2011 | Meguro |
| 7,977,789 B2 | 7/2011 | Park |
| 8,026,181 B2 | 9/2011 | Arita et al. |
| 8,049,303 B2 | 11/2011 | Osaka et al. |
| 8,064,224 B2 | 11/2011 | Mahajan et al. |
| 8,168,458 B2 | 5/2012 | Do et al. |
| 8,178,963 B2 | 5/2012 | Yang |
| 8,178,964 B2 | 5/2012 | Yang |
| 8,183,127 B2 | 5/2012 | Patti et al. |
| 8,193,632 B2 | 6/2012 | Chang et al. |
| 8,227,904 B2 | 7/2012 | Braunisch et al. |
| 8,241,961 B2 | 8/2012 | Kim et al. |
| 8,263,434 B2 | 9/2012 | Pagaila et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,405,225 B2 | 3/2013 | Yu et al. |
| 8,441,131 B2 | 5/2013 | Ryan |
| 8,456,856 B2 | 6/2013 | Lin et al. |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,519,514 B2 | 8/2013 | Fujii |
| 8,524,533 B2 | 9/2013 | Tong et al. |
| 8,620,164 B2 | 12/2013 | Heck et al. |
| 8,647,987 B2 | 2/2014 | Yang et al. |
| 8,691,601 B2 | 4/2014 | Izuha |
| 8,697,493 B2 | 4/2014 | Sadaka |
| 8,716,105 B2 | 5/2014 | Sadaka et al. |
| 8,791,575 B2 | 7/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,878,353 B2 | 11/2014 | Haba et al. |
| 8,901,748 B2 | 12/2014 | Manusharow et al. |
| 8,912,670 B2 | 12/2014 | Teh et al. |
| 8,963,335 B2 | 2/2015 | Woychik et al. |
| 8,975,163 B1 | 3/2015 | Lei et al. |
| 8,975,726 B2 | 3/2015 | Chen et al. |
| 8,987,137 B2 | 3/2015 | Bachman et al. |
| 8,988,299 B2 | 3/2015 | Kam et al. |
| 9,006,908 B2 | 4/2015 | Pincu et al. |
| 9,029,242 B2 | 5/2015 | Holden et al. |
| 9,054,101 B2 | 6/2015 | Semmelmeyer et al. |
| 9,059,010 B2 | 6/2015 | Yoshida et al. |
| 9,076,860 B1 | 7/2015 | Lei et al. |
| 9,076,929 B2 | 7/2015 | Katsuno et al. |
| 9,093,350 B2 | 7/2015 | Endo et al. |
| 9,126,236 B2 | 9/2015 | Roos et al. |
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu |
| 9,171,756 B2 | 10/2015 | Enquist et al. |

(56) References Cited

U.S. PATENT DOCUMENTS

| | | | |
|---|---|---|---|
| 9,171,816 B2 | 10/2015 | Teh et al. |
| 9,184,125 B2 | 11/2015 | Enquist et al. |
| 9,190,380 B2 | 11/2015 | Teh et al. |
| 9,224,697 B1 | 12/2015 | Kwon et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |
| 9,275,971 B2 | 3/2016 | Chiu et al. |
| 9,299,736 B2 | 3/2016 | Chen et al. |
| 9,312,198 B2 | 4/2016 | Meyer et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,433 B2 | 5/2016 | Lee et al. |
| 9,349,703 B2 | 5/2016 | Chiu et al. |
| 9,355,997 B2 | 5/2016 | Katkar et al. |
| 9,368,866 B2 | 6/2016 | Yu |
| 9,373,527 B2 | 6/2016 | Yu et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,570,421 B2 | 2/2017 | Wu et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,653,433 B2 | 5/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,673,096 B2 | 6/2017 | Hirschler et al. |
| 9,674,939 B2 | 6/2017 | Scannell |
| 9,704,827 B2 | 7/2017 | Huang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,865,567 B1 | 1/2018 | Chaware et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,180 B2 | 4/2018 | Kim et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 | 5/2018 | Yu et al. |
| 9,972,611 B2* | 5/2018 | Pappu ............... H01L 22/22 |
| 9,991,231 B2 | 6/2018 | Woychik et al. |
| 10,002,844 B1 | 6/2018 | Wang et al. |
| 10,026,605 B2 | 7/2018 | Doub et al. |
| 10,032,722 B2 | 7/2018 | Yu et al. |
| 10,074,630 B2 | 9/2018 | Kelly et al. |
| 10,075,657 B2 | 9/2018 | Fahim et al. |
| 10,170,409 B2 | 1/2019 | Ganesan et al. |
| 10,204,893 B2 | 2/2019 | Uzoh et al. |
| 10,269,619 B2 | 4/2019 | Yu et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,333,623 B1 | 6/2019 | Liao et al. |
| 10,410,976 B2 | 9/2019 | Asano et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,504,824 B1 | 12/2019 | Pan et al. |
| 10,508,030 B2 | 12/2019 | Katkar et al. |
| 10,510,629 B2 | 12/2019 | Chen et al. |
| 10,522,499 B2 | 12/2019 | Enquist et al. |
| 10,529,690 B2 | 1/2020 | Shih et al. |
| 10,559,507 B1 | 2/2020 | Saketi et al. |
| 10,580,823 B2 | 3/2020 | Zhang et al. |
| 10,629,567 B2 | 4/2020 | Uzoh et al. |
| 10,636,767 B2 | 4/2020 | Haba |
| 10,672,674 B2* | 6/2020 | Yu ............... H01L 22/32 |
| 10,685,937 B2* | 6/2020 | Chen ............... H01L 21/6835 |
| 10,707,087 B2 | 7/2020 | Uzoh et al. |
| 10,707,145 B2 | 7/2020 | Bultitude et al. |
| 10,727,204 B2* | 7/2020 | Agarwal ............. H01L 25/0657 |
| 10,727,219 B2 | 7/2020 | Uzoh et al. |
| 10,770,430 B1* | 9/2020 | Kim ............... H01L 25/50 |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,872,852 B2 | 12/2020 | Shih |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,623 B2* | 10/2021 | Hsu ............... H01L 24/80 |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2* | 3/2022 | Enquist ............... H01L 24/73 |
| 11,296,044 B2 | 4/2022 | Gao et al. |
| 11,296,053 B2* | 4/2022 | Uzoh ............... H01L 23/3121 |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,427 B2 | 6/2022 | Loo et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |

(56) References Cited

U.S. PATENT DOCUMENTS

| | | |
|---|---|---|
| 11,437,423 B2 | 9/2022 | Takachi |
| 11,462,419 B2 | 10/2022 | Haba |
| 11,476,213 B2 | 10/2022 | Haba et al. |
| 11,538,781 B2 | 12/2022 | Haba |
| 11,558,029 B2 | 1/2023 | Ito |
| 11,631,647 B2 | 4/2023 | Haba |
| 11,652,083 B2 | 5/2023 | Uzoh et al. |
| 11,658,173 B2 | 5/2023 | Uzoh et al. |
| 11,728,273 B2 | 8/2023 | Haba |
| 11,764,177 B2 | 9/2023 | Haba |
| 11,764,189 B2 | 9/2023 | Gao et al. |
| 11,817,409 B2 | 11/2023 | Haba et al. |
| 11,837,582 B2 | 12/2023 | Gao et al. |
| 11,837,596 B2 | 12/2023 | Uzoh et al. |
| 11,916,054 B2 | 2/2024 | Enquist et al. |
| 11,916,076 B2 | 2/2024 | DeLaCruz et al. |
| 11,955,463 B2 | 4/2024 | Uzoh et al. |
| 12,046,482 B2 | 7/2024 | Haba |
| 12,046,569 B2 | 7/2024 | Haba |
| 12,113,056 B2 | 10/2024 | Uzoh et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0157407 A1 | 8/2004 | Tong et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0101130 A1 | 5/2005 | Lopatin et al. |
| 2005/0104196 A1 | 5/2005 | Kashiwazaki |
| 2005/0133930 A1 | 6/2005 | Savastisuk et al. |
| 2005/0153522 A1 | 7/2005 | Hwang et al. |
| 2005/0161808 A1 | 7/2005 | Anderson |
| 2005/0218518 A1 | 10/2005 | Jiang et al. |
| 2006/0057945 A1 | 3/2006 | Hsu et al. |
| 2006/0063312 A1 | 3/2006 | Kurita |
| 2006/0087042 A1 | 4/2006 | Kameyama et al. |
| 2006/0220256 A1 | 10/2006 | Shim et al. |
| 2006/0223216 A1 | 10/2006 | Chang et al. |
| 2006/0234473 A1 | 10/2006 | Wong et al. |
| 2006/0278331 A1 | 12/2006 | Dugas et al. |
| 2007/0007639 A1 | 1/2007 | Fukazawa et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0123061 A1 | 5/2007 | Evertsen et al. |
| 2007/0148912 A1 | 6/2007 | Morita et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0165521 A1 | 7/2008 | Bernstein et al. |
| 2008/0227238 A1 | 9/2008 | Ko et al. |
| 2008/0231311 A1 | 9/2008 | Condorelli et al. |
| 2008/0265421 A1 | 10/2008 | Brunnbauer et al. |
| 2008/0268614 A1 | 10/2008 | Yang et al. |
| 2008/0272477 A1 | 11/2008 | Do et al. |
| 2008/0308928 A1 | 12/2008 | Chang |
| 2008/0315372 A1 | 12/2008 | Kuan et al. |
| 2009/0029274 A1 | 1/2009 | Olson et al. |
| 2009/0068831 A1 | 3/2009 | Enquist et al. |
| 2009/0095399 A1 | 4/2009 | Zussy et al. |
| 2009/0149023 A1 | 6/2009 | Koyanagi |
| 2009/0206461 A1 | 8/2009 | Yoon |
| 2009/0227089 A1 | 9/2009 | Plaut et al. |
| 2009/0252939 A1 | 10/2009 | Park et al. |
| 2009/0273094 A1 | 11/2009 | Ha et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0112782 A1 | 5/2010 | Teixeira |
| 2010/0123268 A1 | 5/2010 | Menard |
| 2010/0129999 A1 | 5/2010 | Zingher et al. |
| 2010/0164083 A1 | 7/2010 | Yim |
| 2010/0167534 A1 | 7/2010 | Iwata |
| 2010/0213819 A1 | 8/2010 | Cok et al. |
| 2010/0258952 A1 | 10/2010 | Fjelstad |
| 2010/0259166 A1 | 10/2010 | Cok et al. |
| 2010/0315110 A1 | 12/2010 | Fenner et al. |
| 2010/0327424 A1 | 12/2010 | Braunisch et al. |
| 2011/0042814 A1 | 2/2011 | Okuyama |
| 2011/0049696 A1 | 3/2011 | Haba et al. |
| 2011/0074033 A1 | 3/2011 | Kaltalioglu et al. |
| 2011/0186977 A1 | 8/2011 | Chi et al. |
| 2011/0248397 A1 | 10/2011 | Coffy et al. |
| 2011/0278717 A1 | 11/2011 | Pagaila et al. |
| 2011/0278732 A1 | 11/2011 | Yu et al. |
| 2011/0290552 A1 | 12/2011 | Palmateer et al. |
| 2012/0003792 A1 | 1/2012 | Cheah et al. |
| 2012/0025396 A1 | 2/2012 | Liao et al. |
| 2012/0049344 A1 | 3/2012 | Pagaila et al. |
| 2012/0056314 A1 | 3/2012 | Pagaila et al. |
| 2012/0074585 A1 | 3/2012 | Koo et al. |
| 2012/0077314 A1 | 3/2012 | Park et al. |
| 2012/0119360 A1 | 5/2012 | Kim et al. |
| 2012/0187516 A1 | 7/2012 | Sato |
| 2012/0190187 A1 | 7/2012 | Yang et al. |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2012/0217644 A1 | 8/2012 | Pagaila |
| 2012/0228762 A1 | 9/2012 | Fukuda et al. |
| 2012/0238070 A1 | 9/2012 | Libbert et al. |
| 2013/0001798 A1 | 1/2013 | Choi |
| 2013/0009325 A1 | 1/2013 | Mori |
| 2013/0037936 A1 | 2/2013 | Choi et al. |
| 2013/0037962 A1 | 2/2013 | Xue |
| 2013/0069239 A1 | 3/2013 | Kim et al. |
| 2013/0075923 A1 | 3/2013 | Park et al. |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0187292 A1 | 7/2013 | Semmelmeyer et al. |
| 2013/0214427 A1 | 8/2013 | Nakanoya |
| 2013/0234320 A1 | 9/2013 | Lu et al. |
| 2013/0264684 A1 | 10/2013 | Yu et al. |
| 2013/0265733 A1 | 10/2013 | Herbsommer et al. |
| 2013/0277855 A1 | 10/2013 | Kang et al. |
| 2013/0299997 A1 | 11/2013 | Sadaka |
| 2013/0334697 A1 | 12/2013 | Shin et al. |
| 2014/0008789 A1 | 1/2014 | Cho |
| 2014/0013606 A1 | 1/2014 | Nah et al. |
| 2014/0097536 A1 | 4/2014 | Schunk |
| 2014/0124818 A1 | 5/2014 | Hwang et al. |
| 2014/0154839 A1 | 6/2014 | Ahn et al. |
| 2014/0175655 A1 | 6/2014 | Chen et al. |
| 2014/0187040 A1 | 7/2014 | Enquist et al. |
| 2014/0217604 A1 | 8/2014 | Chou et al. |
| 2014/0225795 A1 | 8/2014 | Yu |
| 2014/0264836 A1 | 9/2014 | Chun et al. |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0048503 A1 | 2/2015 | Chiu et al. |
| 2015/0064498 A1 | 3/2015 | Tong |
| 2015/0097022 A1 | 4/2015 | Di Cioccio et al. |
| 2015/0102468 A1 | 4/2015 | Kang et al. |
| 2015/0130030 A1 | 5/2015 | Ma et al. |
| 2015/0130082 A1 | 5/2015 | Lu et al. |
| 2015/0145140 A1 | 5/2015 | Haba et al. |
| 2015/0162294 A1 | 6/2015 | Kawasaki |
| 2015/0171050 A1 | 6/2015 | Chen et al. |
| 2015/0171063 A1 | 6/2015 | Zhai et al. |
| 2015/0179481 A1 | 6/2015 | Lin |

(56) References Cited

U.S. PATENT DOCUMENTS

| | | |
|---|---|---|
| 2015/0179605 A1* | 6/2015 | Dubey .................... H01L 24/05 257/777 |
| 2015/0194406 A1 | 7/2015 | Teh et al. |
| 2015/0200153 A1 | 7/2015 | Wang et al. |
| 2015/0200182 A1 | 7/2015 | Wang et al. |
| 2015/0206865 A1 | 7/2015 | Yu et al. |
| 2015/0235949 A1 | 8/2015 | Yu et al. |
| 2015/0235991 A1 | 8/2015 | Gu et al. |
| 2015/0270209 A1 | 9/2015 | Woychik et al. |
| 2015/0287672 A1 | 10/2015 | Yazdani |
| 2015/0287697 A1 | 10/2015 | Tsai et al. |
| 2015/0303174 A1 | 10/2015 | Yu et al. |
| 2015/0340285 A1 | 11/2015 | Enquist et al. |
| 2015/0371951 A1 | 12/2015 | Yeh et al. |
| 2016/0035687 A1 | 2/2016 | Lin et al. |
| 2016/0071770 A1 | 3/2016 | Albermann et al. |
| 2016/0093592 A1 | 3/2016 | Zhai |
| 2016/0141267 A1 | 5/2016 | Hagimoto et al. |
| 2016/0155724 A1 | 6/2016 | Kim et al. |
| 2016/0163650 A1 | 6/2016 | Gao et al. |
| 2016/0190103 A1 | 6/2016 | Kabe et al. |
| 2016/0218082 A1 | 7/2016 | Lee et al. |
| 2016/0233175 A1 | 8/2016 | Dubey et al. |
| 2016/0233196 A1 | 8/2016 | Kim et al. |
| 2016/0254249 A1 | 9/2016 | Jeng et al. |
| 2016/0260684 A1 | 9/2016 | Zhai et al. |
| 2016/0276296 A1 | 9/2016 | Woychik et al. |
| 2016/0300813 A1 | 10/2016 | Zhai et al. |
| 2016/0300817 A1 | 10/2016 | Do et al. |
| 2016/0315071 A1 | 10/2016 | Zhai et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0343695 A1 | 11/2016 | Lin et al. |
| 2016/0351499 A1 | 12/2016 | Kitada |
| 2016/0358891 A1 | 12/2016 | Geissler et al. |
| 2016/0372323 A1 | 12/2016 | Doub et al. |
| 2017/0023405 A1 | 1/2017 | Fahim et al. |
| 2017/0062366 A1 | 3/2017 | Enquist |
| 2017/0062383 A1 | 3/2017 | Yee et al. |
| 2017/0084576 A1 | 3/2017 | Yu et al. |
| 2017/0179078 A1 | 4/2017 | Yu et al. |
| 2017/0125379 A1 | 5/2017 | Chen et al. |
| 2017/0141040 A1 | 5/2017 | Yu et al. |
| 2017/0148764 A1 | 5/2017 | Wang et al. |
| 2017/0148777 A1 | 5/2017 | Bono et al. |
| 2017/0179029 A1 | 6/2017 | Enquist et al. |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1 | 7/2017 | Kao et al. |
| 2017/0243845 A1 | 8/2017 | Lee et al. |
| 2017/0250160 A1 | 8/2017 | Wu et al. |
| 2017/0250161 A1 | 8/2017 | Haba |
| 2017/0263518 A1 | 9/2017 | Yu et al. |
| 2017/0263595 A1 | 9/2017 | Kurita et al. |
| 2017/0284951 A1 | 10/2017 | Pindl et al. |
| 2017/0287874 A1 | 10/2017 | Fang et al. |
| 2017/0294422 A1 | 10/2017 | Solimando et al. |
| 2017/0330855 A1 | 11/2017 | Tung et al. |
| 2017/0338214 A1 | 11/2017 | Uzoh et al. |
| 2017/0345761 A1 | 11/2017 | Yu et al. |
| 2017/0358533 A1 | 12/2017 | Briggs et al. |
| 2017/0358553 A1 | 12/2017 | Kim et al. |
| 2017/0365580 A1 | 12/2017 | Shih et al. |
| 2017/0365582 A1 | 12/2017 | Seo et al. |
| 2017/0365591 A1 | 12/2017 | Chang et al. |
| 2018/0005984 A1 | 1/2018 | Yu et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0026008 A1 | 1/2018 | Jeng et al. |
| 2018/0053746 A1 | 2/2018 | Yu et al. |
| 2018/0061741 A1 | 3/2018 | Beyne |
| 2018/0068958 A1* | 3/2018 | Cho .................... H01L 25/0657 |
| 2018/0068978 A1 | 3/2018 | Jeng et al. |
| 2018/0096931 A1 | 4/2018 | Huang et al. |
| 2018/0096988 A1 | 4/2018 | Long et al. |
| 2018/0122774 A1 | 5/2018 | Huang et al. |
| 2018/0130769 A1 | 5/2018 | Tan et al. |
| 2018/0151477 A1 | 5/2018 | Yu et al. |
| 2018/0158749 A1 | 6/2018 | Yu et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0269143 A1 | 9/2018 | Adams et al. |
| 2018/0273377 A1 | 9/2018 | Katkar et al. |
| 2018/0286805 A1 | 10/2018 | Huang et al. |
| 2018/0294212 A1 | 10/2018 | Chen et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1 | 11/2018 | Yu et al. |
| 2018/0366436 A1 | 12/2018 | Wang et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0029119 A1 | 1/2019 | Weber |
| 2019/0043792 A1 | 2/2019 | Weerasekera et al. |
| 2019/0067247 A1 | 2/2019 | Yoo et al. |
| 2019/0088621 A1 | 3/2019 | Yang et al. |
| 2019/0096741 A1 | 3/2019 | Uzoh et al. |
| 2019/0096825 A1 | 3/2019 | Kim et al. |
| 2019/0096842 A1 | 3/2019 | Fountain, Jr. et al. |
| 2019/0103409 A1 | 4/2019 | Xu et al. |
| 2019/0109119 A1 | 4/2019 | Shih et al. |
| 2019/0115277 A1 | 4/2019 | Yu et al. |
| 2019/0123006 A1 | 4/2019 | Chen et al. |
| 2019/0131277 A1 | 5/2019 | Yang et al. |
| 2019/0157333 A1 | 5/2019 | Tsai |
| 2019/0189590 A1 | 6/2019 | Agarwal et al. |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0221548 A1 | 7/2019 | Huang et al. |
| 2019/0237374 A1 | 8/2019 | Huang et al. |
| 2019/0265411 A1 | 8/2019 | Huang et al. |
| 2019/0267334 A1 | 8/2019 | Bowers |
| 2019/0319007 A1 | 10/2019 | Uzoh et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0341332 A1* | 11/2019 | Lin .................... H01L 25/18 |
| 2019/0341350 A1 | 11/2019 | Huang et al. |
| 2019/0348336 A1 | 11/2019 | Katkar et al. |
| 2019/0355637 A1 | 11/2019 | Chen et al. |
| 2019/0355706 A1 | 11/2019 | Enquist et al. |
| 2019/0371763 A1 | 12/2019 | Agarwal et al. |
| 2019/0372000 A1 | 12/2019 | Yu et al. |
| 2019/0385935 A1 | 12/2019 | Gao et al. |
| 2019/0385966 A1 | 12/2019 | Gao et al. |
| 2020/0006173 A1 | 1/2020 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1* | 1/2020 | Fountain, Jr. ....... H01L 21/2007 |
| 2020/0035560 A1 | 1/2020 | Block et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0098736 A1 | 3/2020 | Liao et al. |
| 2020/0106156 A1 | 4/2020 | Lu et al. |

(56) References Cited

U.S. PATENT DOCUMENTS

| | | |
|---|---|---|
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0185367 A1 | 6/2020 | Bhagavat et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0303311 A1 | 9/2020 | Young et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0057309 A1 | 2/2021 | Hu et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0104487 A1 | 4/2021 | Uzoh et al. |
| 2021/0111125 A1 | 4/2021 | Chen et al. |
| 2021/0118832 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1 | 7/2021 | Wu et al. |
| 2021/0225708 A1 | 7/2021 | Lee et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0375827 A1 | 12/2021 | Chen et al. |
| 2021/0384133 A1 | 12/2021 | Ong et al. |
| 2021/0384135 A1 | 12/2021 | Kuan et al. |
| 2021/0384158 A1 | 12/2021 | Chung et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0407941 A1 | 12/2021 | Haba |
| 2022/0005787 A1 | 1/2022 | Han et al. |
| 2022/0020729 A1 | 1/2022 | Gao et al. |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0375864 A1 | 11/2022 | Wang et al. |
| 2022/0399294 A1 | 12/2022 | Dogiamis et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215739 A1 | 7/2023 | Haba et al. |
| 2023/0215836 A1 | 7/2023 | Haba et al. |
| 2023/0245950 A1 | 8/2023 | Haba et al. |
| 2023/0253367 A1 | 8/2023 | Gao et al. |
| 2023/0268300 A1 | 8/2023 | Uzoh et al. |
| 2023/0282610 A1 | 9/2023 | Uzoh et al. |
| 2023/0282634 A1 | 9/2023 | Enquist et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420398 A1 | 12/2023 | Haba |
| 2023/0420399 A1 | 12/2023 | Haba et al. |
| 2024/0006377 A1 | 1/2024 | Wang et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0088120 A1 | 3/2024 | Enquist et al. |
| 2024/0105674 A1 | 3/2024 | Uzoh et al. |
| 2024/0145458 A1 | 5/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0243103 A1 | 7/2024 | Gao et al. |
| 2024/0266255 A1 | 8/2024 | Haba et al. |

(56) References Cited

U.S. PATENT DOCUMENTS

| | | |
|---|---|---|
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332248 A1 | 10/2024 | Uzoh |
| 2024/0332267 A1 | 10/2024 | Haba et al. |
| 2024/0387419 A1 | 11/2024 | Mrozek et al. |

FOREIGN PATENT DOCUMENTS

| | | |
|---|---|---|
| EP | 1011133 A1 | 6/2000 |
| EP | 2 339 614 A1 | 6/2011 |
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2007-294724 A | 11/2007 |
| JP | 2008-130603 A | 6/2008 |
| JP | 2009-135348 | 6/2009 |
| JP | 2010-034294 A | 2/2010 |
| JP | 2010-073964 | 4/2010 |
| JP | 2011001412 A | 1/2011 |
| JP | 2011-171614 | 9/2011 |
| JP | 2012191062 A | 10/2012 |
| JP | 2013-33786 | 2/2013 |
| JP | 2013168577 A | 8/2013 |
| JP | 2017-130610 | 7/2017 |
| JP | 2018-160519 | 10/2018 |
| KR | 10-2001-0104643 | 11/2001 |
| KR | 10-2004-0020827 | 3/2004 |
| KR | 10-2010-0123755 | 11/2010 |
| KR | 10-2015-0097798 | 8/2015 |
| KR | 10-2018-0054419 | 5/2018 |
| KR | 101901711 B1 | 9/2018 |
| KR | 10-2020-0060670 | 6/2020 |
| KR | 10-2020-0092236 | 8/2020 |
| TW | I464810 B | 12/2014 |
| WO | WO 2005/043584 A2 | 5/2005 |
| WO | WO 2006/100444 A1 | 9/2006 |
| WO | WO 2008/112101 A2 | 9/2008 |
| WO | WO 2009/005898 A1 | 1/2009 |
| WO | WO 2010/024678 A1 | 3/2010 |
| WO | WO 2012/004964 A1 | 1/2012 |
| WO | WO 2014/052445 A1 | 4/2014 |
| WO | WO 2015/134227 A1 | 9/2015 |
| WO | WO 2017/034654 A1 | 3/2017 |
| WO | WO 2017/052652 A1 | 3/2017 |
| WO | WO 2017/151442 A1 | 9/2017 |
| WO | WO 2019/054364 A1 | 3/2019 |

OTHER PUBLICATIONS

"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.

"The effects of edge trimming—Engineering R&D Division, Operation V," Disco Technical Review, Mar. 2016, 3 pages.

Amirfeiz et al., "Formation of silicon structures by plasma-activated wafer bonding," Journal of the Electrochemical Society, 2000, vol. 147, No. 7, pp. 2693-2698.

Braunisch, H. et al., "High-speed performance of silicon bridge die-to-die interconnects," 2011 IEEE, pp. 95-98.

Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Ceramic Microstructures: Control at the Atomic Level, Recent Progress in Surface Activated Bonding, 1998, pp. 385-389.

Chang, T.C. et al., "A method for fabricating a superior oxide/nitride/oxide gate stack," Electrochemical and Solid-State Letters, 2004, vol. 7, No. 7, pp. G138-G140.

Chung et al., "Room temperature GaAs—Si and InP—Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

European Supplementary Search Report mailed Jul. 24, 2023, European Application No. 20830730.6, 15 pages.

Extended European Search Report dated Nov. 29, 2023, European Application No. 20830730.6, 19 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Frumusanu, Andrei, "TSMC's version of EMIB is 'LSI': Currently in pre-qualification," AnandTech, https://www.anandtech.com/show/16031/tsmcs-version-of-emib-lsi-3dfabric, Aug. 25, 2020, 6 pages.

Fukushima, T. et al., "New three-dimensional integration technology using self-assembly technique," International Electron Devices Meeting 5-7.12.2005, IEEE, Dec. 5, 2005, pp. 348-351.

Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.

Gösele et al., "Semiconductor Wafer Bonding: A flexible approach to materials combinations in microelectronics; micromechanics and optoelectronics," IEEE, 1997, pp. 23-32.

Hooper, A. et al. "Review of wafer dicing techniques for via-middle process 3DI/TSV ultrathin silicon device wafers," 2015 IEEE 65th Electronic Components and Technology Conference (ECTC).

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference on, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-Sioon-GaAs wafers bonded by surface activated bonding at room temperature," J. Vac. Sci. Technol. B 19, Nov./Dec. 2001, pp. 2114-2118.

International Search Report and Written Opinion dated Jul. 2019, issued in International Application No. WO 2020/028080, 9 pages.

International Search Report and Written Opinion mailed Apr. 22, 2019 in International Application No. PCT/US2018/064982, 13 pages.

International Search Report and Written Opinion mailed Oct. 12, 2020, issued in International Application No. PCT/US2020/039632, 2 pages.

(56) References Cited

OTHER PUBLICATIONS

Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jin et al., "Silicon/Silicon Oxide/LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, Mar. 2006; 3 pages.
Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.
Khan et al., "Technologies for printing sensors and electronics over large flexible substrates," IEEE Sensors Journal, Jun. 2015, vol. 15, No. 6, pp. 3164-3185.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Lei, W.S. et al., "Die singulation technologies for advanced packaging: A critical review," J. Vac. Sci. Technol. B 30(4), Apr. 6, 2012, Jul./Aug. 1012, pp. 040801-1-040801-27.
Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Electronic Components and Technology Conference, 2001, 51st Proceedings, IEEE, pp. 384-387. (Abstract only).
Moriceau, H. et al., "Overview of recent direct wafer bonding advances and applications," Adv Nat Sciences: Nanoscience and Nanotechnology, Dec. 2010;1(4):043004; 11 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Nasa SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, Final Summary Jul. 2010; 1 page.
Oberhammer, J. et al., "Sealing of adhesive bonded devices on wafer level," Sensors and Actuators A, 2004, vol. 110, No. 1-3, pp. 407-412.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820.".
Plössl, A. et al., "Wafer direct bonding: tailoring adhesion between brittle materials," Materials Science and Engineering: R: Reports. Mar. 10, 1999;25(1-2):1-88.
Reiche et al., "The effect of a plasma pretreatment on the Si/Si bonding behaviour," Electrochemical Society Proceedings, 1998, vol. 97-36, pp. 437-444.
Roberds et al., "Low temperature , in situ, plasma activated wafer bonding," Electrochemical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Conference, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

(56) References Cited

OTHER PUBLICATIONS

Supplemental European Search Report dated Jun. 19, 2019 in European Application No. 17799846.5, 16 pages.
Swaminathan, P., "Lecture 29: Productivity and process yield," National Programme on Technology Enhanced Learning (NPTEL), MM5017: Electronic materials, devices, and fabrication, (2016); 16 pages.
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mechanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D Mems and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756. (Abstract only).
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483. (Abstract only).
Michailos, Jean, "Future landscape for 3D Integration: from Interposers to 3D High Density," 3d ASIP—Dec. 13-15, 2016, San Francisco Airport, USA, 46 pages.
Japanese Office Action dispatched Jun. 17, 2024, Application No. 2021-576501; 6 pages.

* cited by examiner

MOLDED BONDED DIES WITH LATERAL DIE SUPPORT STRUCTURE

MULTIPLE THIN DIES DIRECT BONDED AT
HIGH TEMPERATURE 150 - 350 °C

TOP DIE DIRECT BONDED AT LOWER
TEMPERATURE <150 °C

MOLDED BONDED DIES WITHOUT
LATERAL DIE SUPPORT STRUCTURE

MOLDED BONDED DIES WITH LATERAL
DIE SUPPORT STRUCTURE

BONDED MULTIPLE THIN DIES

MULTIPLE DIRECT-BONDED THIN DIES
REINFORCED WITH UNDERFILL
AS LATERAL SUPPORT

BONDING OF MULTIPLE DIES ONTO
LATERALLY REINFORCED STACK

MOLDING AROUND BONDED DIE STACK

BONDED MULTIPLE THIN DIES

BONDING A 5TH DIE WITH A COMPLIANT LAYER OF A BONDED DIES ARRAY

BONDED DIES WITH MORE THAN ONE COMPLIANT LAYER

ENCAPSULATION OF BONDED DIES WITH COMPLIANT LAYER

DIRECT BONDED STACK STRUCTURES FOR INCREASED RELIABILITY AND IMPROVED YIELD IN MICROELECTRONICS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Stacks of integrated circuit microchips ("dies") bonded together during fabrication of conventional 3DIC microelectronic packages, such as high bandwidth memory modules (HBM, HBM2, HBM3), are vulnerable to certain types of defects by virtue of the vertical stacking, and these defects affect the overall production yield. In the case of the HBM2 modules, for example, memory specifications may dictate some physical dimensions of the modules to be constructed, such as a 700 µm height requirement.

As shown in FIG. 1, the high bandwidth of an example conventional HBM2 memory module 100 is achieved by bonding multiple memory dies 102 together in a vertical stack 103 on a substrate 104. Each individual die 102 may have a certain vertical thickness, such as 55 µm. At the top of the vertical stack, a top die 106 to be added is often made thicker than the other dies 102 in order to reach the 700 µm (or other) specification for height. For example, the top die 106 may be 90-400 µm in thickness, compared to 55 µm in thickness for each of the dies 102 below the top die 106. In some cases, this top die 106 may be a dummy or spacer die. The module 100 may be filled out and completed with a side filler 108, underfill, or molding material.

The thicker top die 106 may cause structural problems for the dies 102 stacked beneath it during fabrication, decreasing the average reliability and overall production yield. For various reasons, the multiple thin dies 102 forming the vertical memory stack 103 under the top die 106 may assume a negative warpage, with the warp facing concave side down 110. The thicker top die 106 often ends up with a positive warpage, facing concave-up 112. When the concave-up top die 106 is pressed into the concave-down stack of dies 102 beneath it during bonding to the vertical stack 103, destructive defects such as cracking 114 of the direct bonded dies 102, delamination 116 of the bond between dies, or cracking and chipping 118 of the substrate 104 underlying the vertical stack at points of increased pressure may occur in a certain number of instances, decreasing overall yield. The cracking 114 of thin dies 102 may occur near the edges of the dies 102, when there is a slight difference in footprint sizes between the dies 102, creating small overhangs where pressure forces can concentrate.

SUMMARY

Direct bonded stack structures for increased reliability and improved yields in microelectronics are provided. Structural features and stack configurations are provided for memory modules and 3DICs to reduce both severe and minor defects in vertically stacked dies. Example processes alleviate warpage stresses between a thicker top die and direct bonded dies beneath it, for example. In one technique, an etched surface on the top die may relieve warpage stresses. In another technique, an example stack may include a compliant layer between the top die and dies beneath it. Another example stack configuration replaces the top die with a layer of molding material to circumvent warpage stresses. An array of cavities on the bonding surface of the top die can also alleviate stress forces. One or more stress balancing layers may also be created on the topside or backside of the top die, or between thin dies as another way to relieve stack stresses and warpage. Rounding of edges can prevent stresses and pressure forces from being destructively transmitted through die and substrate layers. These various techniques and structures are not mutually exclusive, but may be used together or in various combinations in the package.

This summary is not intended to identify key or essential features of the claimed subject matter, nor is it intended to be used as an aid in limiting the scope of the claimed subject matter.

DETAILED DESCRIPTION

Overview

This disclosure describes direct bonded stack structures for increased reliability and improved yields in microelectronics. Structural features and stack configurations are provided for memory modules, stacked passive elements, interposers, and 3DICs to reduce both severe and minor defects in vertically stacked dies. Example processes and structures alleviate stresses, such as warpage stresses, between a thicker top die and direct bonded dies beneath it or a thinner top die directly bonded to a thicker die beneath, for example.

In an implementation, a surface that has been ground and etched on the top die may relieve stresses, such as warpage stresses, of the stack of dies. In the same or another implementation, the example stack may include a compliant layer between the top die and dies beneath it to relieve warpage stresses. In an implementation, another stack configuration replaces the top die with a layer of molding material to circumvent warpage stresses. In another implementation, an array of cavities on the bonding surface of the top die or elsewhere can alleviate stress forces. Yet again, a stress balancing layer may also be created on the topside or backside of the top die to relieve warpage stresses of the stack, or one or more stress balancing layers can intervene between other dies in a stack of dies. In another example technique and related structure, right-angle corners of some dies in a stack are rounded to prevent concentration of pressing forces at square corners of dies during stack fabrication, and to prevent transmission of those concentrated forces to relatively fragile dies or substrate layer below or above, cracking and chipping them.

Example Processes and Systems

Example processes fabricate stack structures with structural features and configurations to reduce severe and minor defects that can occur in vertical stacks of direct bonded dies. Memory modules include, but are not limited to, 3DS®, HMC hybrid memory cube, HBM, HBM2 and HBM3, which are described below as representative examples, but the described technology can be applied to any microelectronics package with vertically stacked dies, especially dies that are direct bonded together, and the structures and techniques described herein are not limited to memory modules.

It should be noted that the embodiments described below can in some cases be combined together in a single embodiment that includes the features of each embodiment described below. The embodiments described below are not intended to be mutually exclusive, but may be combined together, when possible.

Figure 1:
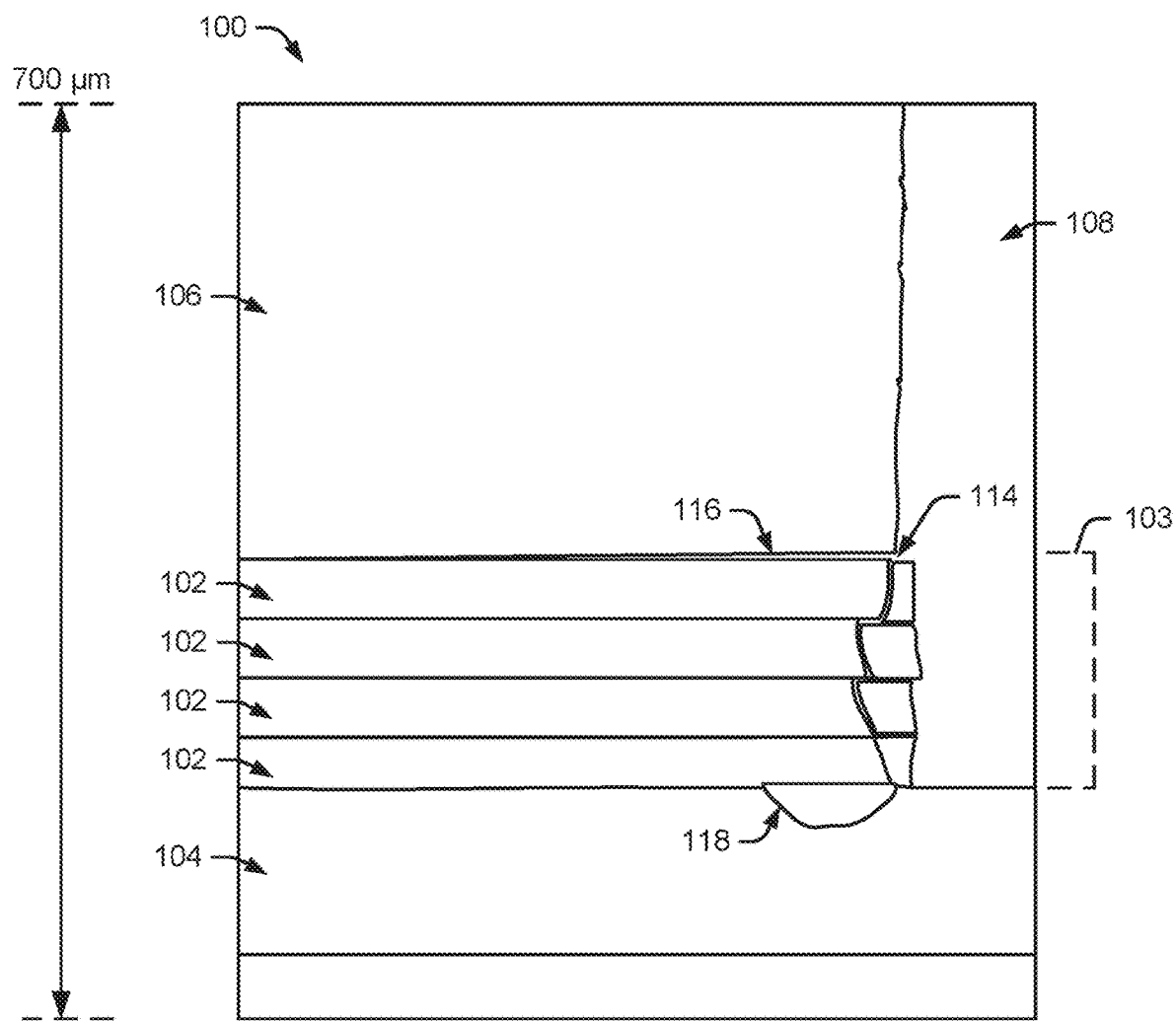
FIG. 1 is a diagram of a conventional prior art vertical die stack with structural problems introduced by various stresses and die warpage, including delamination of bonds, cracking, and chipping resulting in unreliability and decreased production yield.
Figure 1:
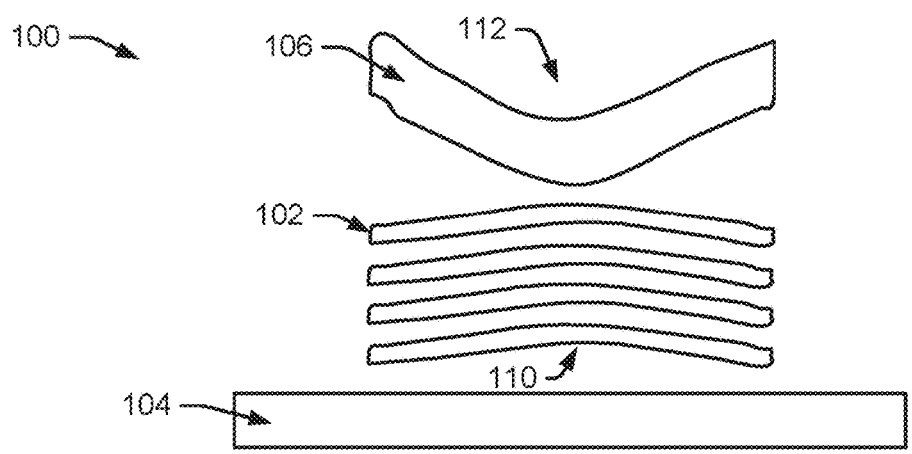
Figure 2:
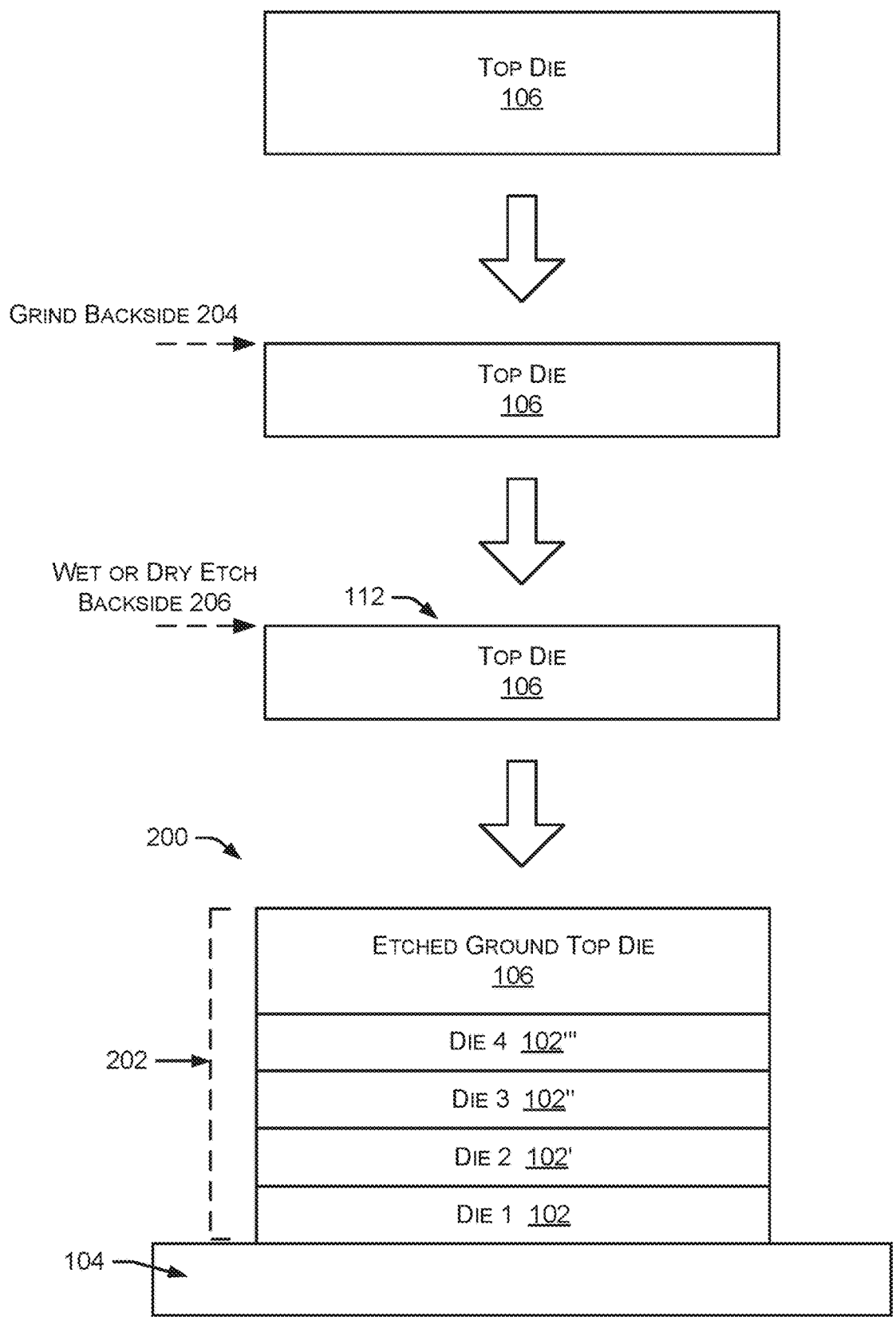
FIG. 2 is a diagram of an example module with a grind/etch feature for alleviating a warpage stresses in a vertical stack of dies.

FIG. 2 shows an example memory module 200 with a die stack 202 that includes a feature for alleviating a warpage stress in the vertical stack 202. The top die 106 of the stack 202 has a surface that is treated by grinding 204 and then either wet etching 206 or dry etching 206 to relieve a warpage 112 or an internal stress of the top die 106, thus decreasing or eliminating its concavity 112 in some cases. The etching 206 relieves pent up stress from the grinding operation 204. This in turn helps to relieve defects resulting from stress forces that can occur between the top die 106 and the dies 102 beneath it. As above, substrate 104 may be an organic or inorganic structure, such as a circuit board, package substrate, die, wafer, carrier etc, which may be electrically coupled to the stack 202, including coupling at least in part through direct and/or hybrid bonding, eutectic bonding, etc.

Figure 3:
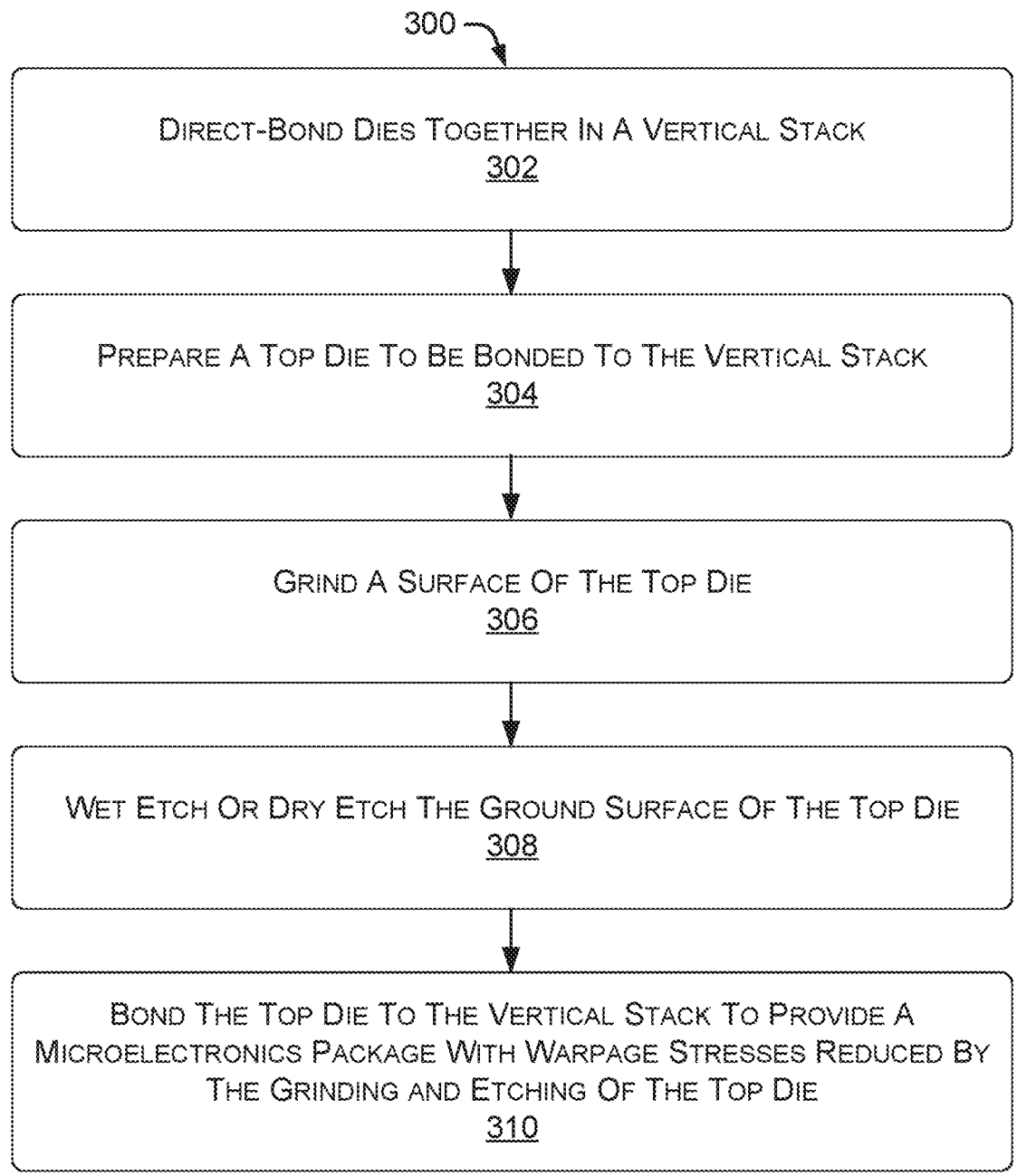
FIG. 3 is a flow diagram of an example process for making the structure of FIG. 2.

FIG. 3 shows an example process 300 for making the structure 200 of FIG. 2. In FIG. 3, operations of the example process are shown in individual blocks.

At block 302, the example process includes direct bonding dies 102 together to make part of the vertical stack 202.

At block 304, the top die 106 is prepared for bonding to the top of the other dies 102 to form vertical stack 202.

At block 306, the backside of the top die 106 is ground.

At block 308, the backside of the top die 106 is then wet etched 206 or dry etched for stress relief.

At block 310, the top die 106 is then bonded to the dies below 102, to produce a microelectronics package 200 of vertically stacked dies 102 & 106 with reduced internal stress and increased reliability, thereby alleviating a warpage stress between the top die 106 and the dies 102 in the vertical stack beneath the top die 106.

Figure 4:
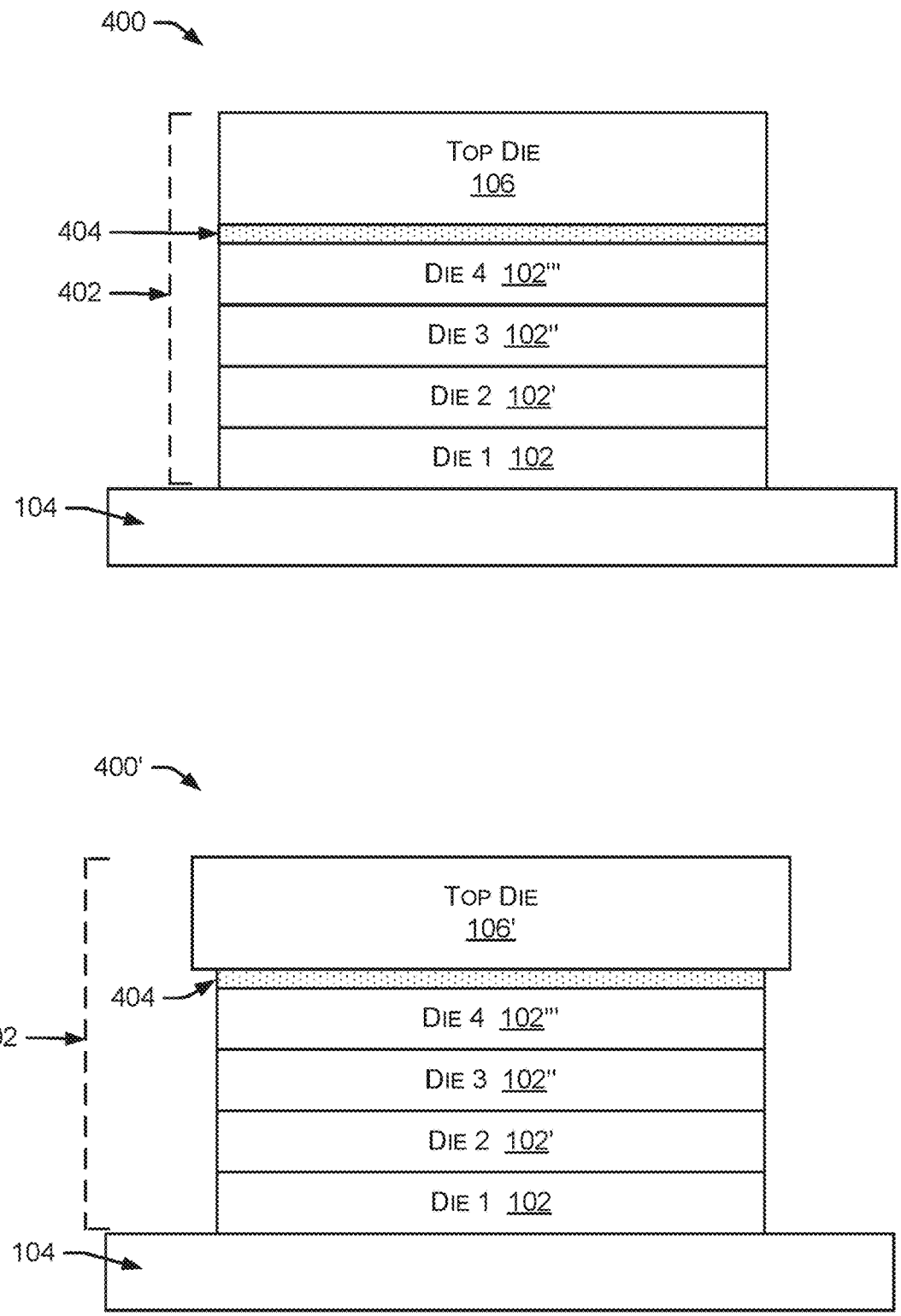
FIG. 4 is a diagram of an example module with a vertical die stack that includes a compliant layer feature for alleviating a warpage stress in the vertical stack.

FIG. 4 shows an example memory module 400 with a die stack 402 that includes a feature for alleviating a warpage stress in the vertical stack 402. The vertical stack 402 is fabricated with a compliant layer 404 intervening in between the top die 106 and the dies 102 direct bonded to each other beneath the top die 106. The top die may have different vertical and/or horizontal dimensions than at least one other die in the direct bonded die stack 400.

The compliant layer 404 is intended to cushion uneven forces during bonding of the top die 106 to the vertical stack 402, and to counteract or dissipate ongoing unevenness of stresses and warpage forces between the top die 106 and the dies 102 beneath. The thickness of the compliant material or compliant layer 404 may range between 0.5-55.0 microns and preferably between 3.0-30.0 microns. The compliant layer 404 may be adhered or bonded between the dies, and can provide a single solution to warpage when the top die 106 is a dummy die for filling the top space of the package 400. The compliant layer 404 may be adhered or bonded between the dies, and can provide a single solution to warpage when the top die 106 is a dummy die for filling the top space of the package 400. The Young's modulus of compliant layer 404 is preferably less than 4 GPa.

In some embodiments, as in stack 400, the width of the top die 106 is similar to the width of one of the dies below 102. In other embodiments, as in stack 400', the width of the top die 106' is different from a width of other dies in the vertical stack 400', and may be wider than the dies 102 below, for example.

Figure 5:
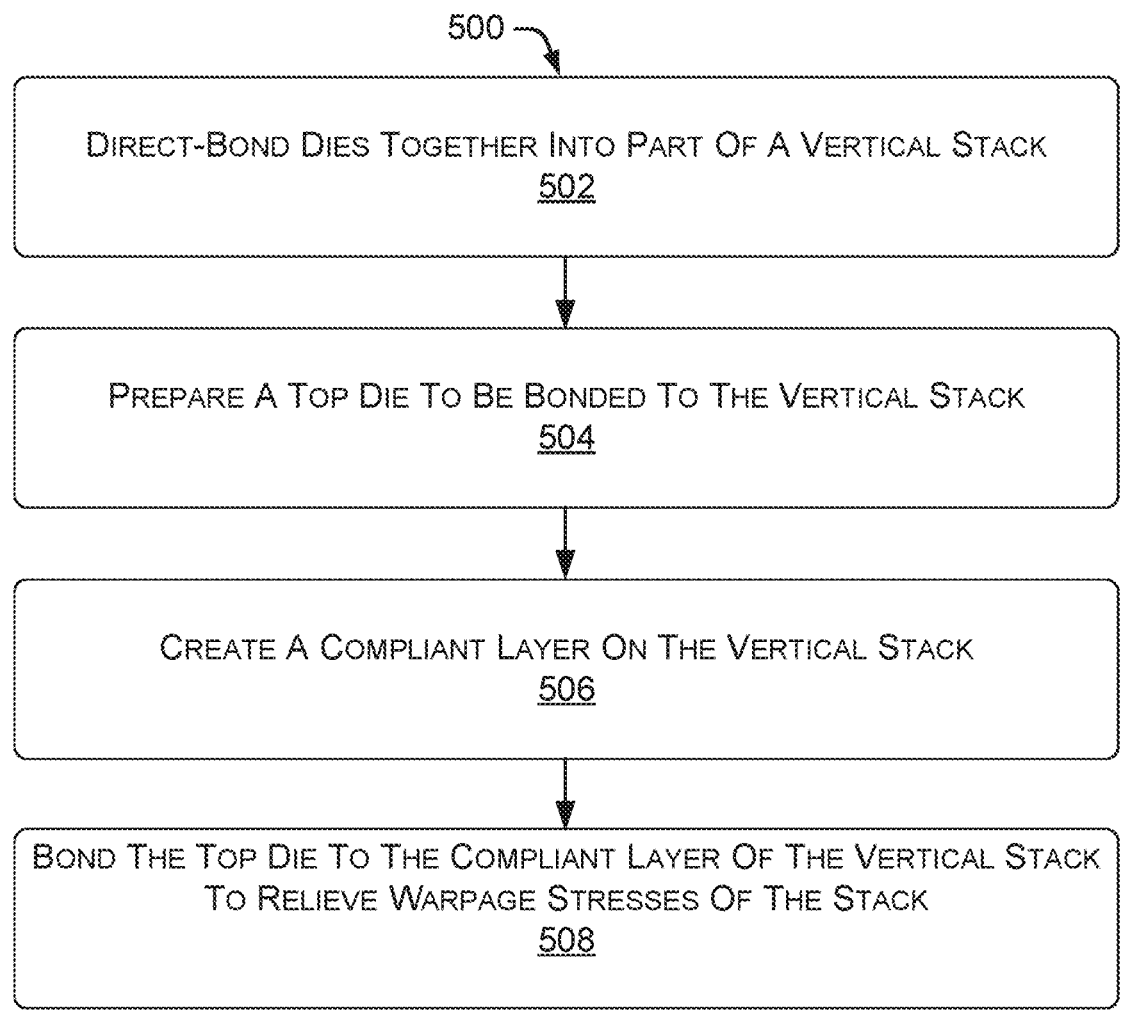
FIG. 5 is a flow diagram of an example process for fabricating the example module FIG. 4.

FIG. 5 shows an example process 500 for fabricating the example module 400 of FIG. 4. Operations of the example process 500 are shown in individual blocks.

At block 502, the example process 500 includes direct bonding dies 102 together to make part of a vertical stack 402.

At block 504, a top die 106 is prepared for bonding to the top of the direct bonded dies 102.

At block 506, a compliant layer 404 is applied to interpose between the top die 106 and other dies 102 of the vertical stack 402, for example.

At block 508, the top die 106 is then bonded to the compliant layer 404. The compliant layer may be an adhesive or another compliant material bonded by thin film die attach, printed or stenciled die attach material, or other adhesives, for example. The microelectronics package 400 with vertically stacked dies 102 & 106 and compliant layer 404 provides reduced internal stress and increased reliability, alleviating a warpage stress between the top die 106 and the dies 102 of the vertical stack 402. A flowable material that sets may be used for the compliant layer 404. The dispensed material flows and will accommodate the warpage very well. In the thin film die attach embodiment, flow is achieved at elevated temperatures and the flowed material also accommodates the height differences across warped dies to alleviate the warpage. The width of the top die 106 may be similar or different than the width of the dies below 102, as in FIG. 4.

Figure 6:
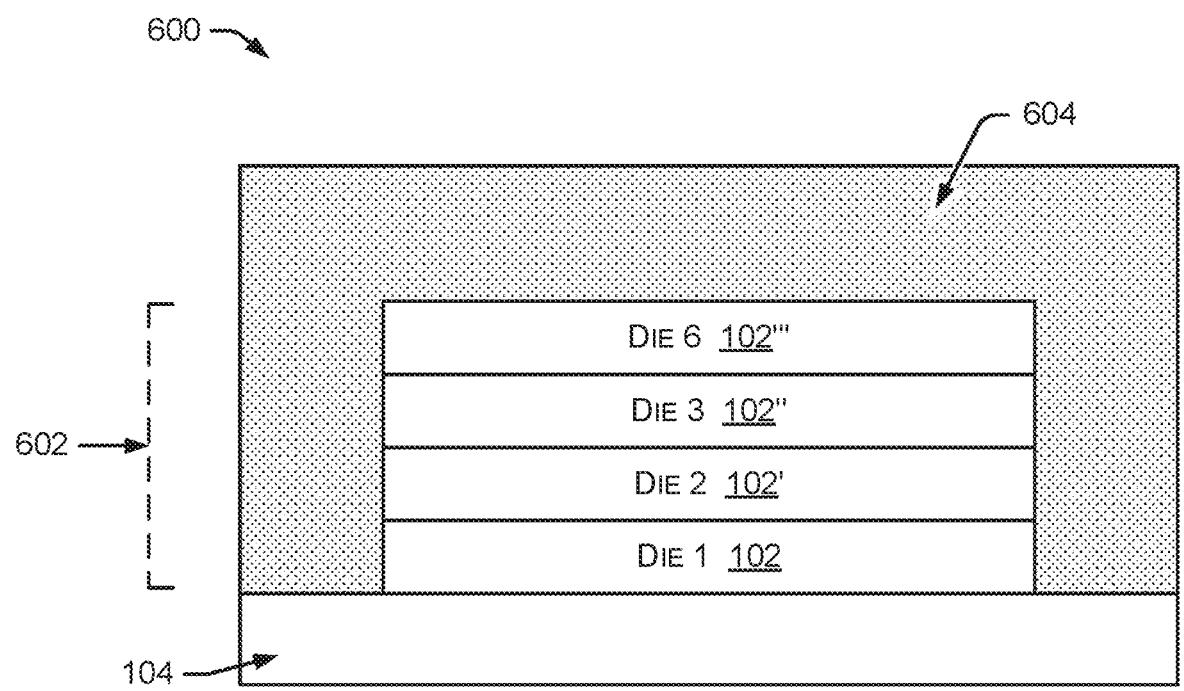
FIG. 6 is a diagram of an example module with a die stack that includes a molding feature for alleviating a warpage stress in the vertical stack.

FIG. 6 shows as example module, a microelectronics package 600 with a die stack 602 that includes a fill feature for alleviating a warpage stress in the vertical stack 602. In this example microelectronics package 600, a volume of molding material 604, filler, underfill material, etc., substitutes for a top die 106, which is eliminated in this embodiment. Since there is no conflict of warpage stresses between the positive warpage of a top die that is not present, and the dies 102 of the stack 602 that may have a negative warpage, the actual dies 102 in the vertical stack 602 remain with a slight but acceptable negative warpage, and the microelectronics package 600 is filled out with the molding compound 604 to complete the microelectronics package 600. The residual negative warpage of the direct bonded dies 102 may also be addressed and alleviated with a stress balancing layer as described with respect to FIGS. 10-11. One or more stress balancing layers (not shown in FIG. 6) can be applied on or within the stack 602 to counterbalance and cancel out the net warpage of the entire stack 602. Or, such stress balancing layers can be matched with each individual die 102 to be bonded into the stack 602.

Each stress balancing layer is designed to counteract a camber of a warped die or stack, with an opposite camber of its own, before the stress balancing layer and the warped die or stack are mated together, at which point the cambers cancel each other out resulting in a flat stack 602 with a net overall warp of zero. Also, in the microelectronics package 600, the lateral width of the molding material 604 on the either side of the stacked dies 602 is smaller than a width of the dies 102 and preferably less than 10% of the width of the dies 102. In some embodiments, the vertical thickness of the molding material abutting the top 102 die is less than the thickness of the die stack 602 and preferably less than 50% of the vertical thickness of the die stack 602.

Figure 7:
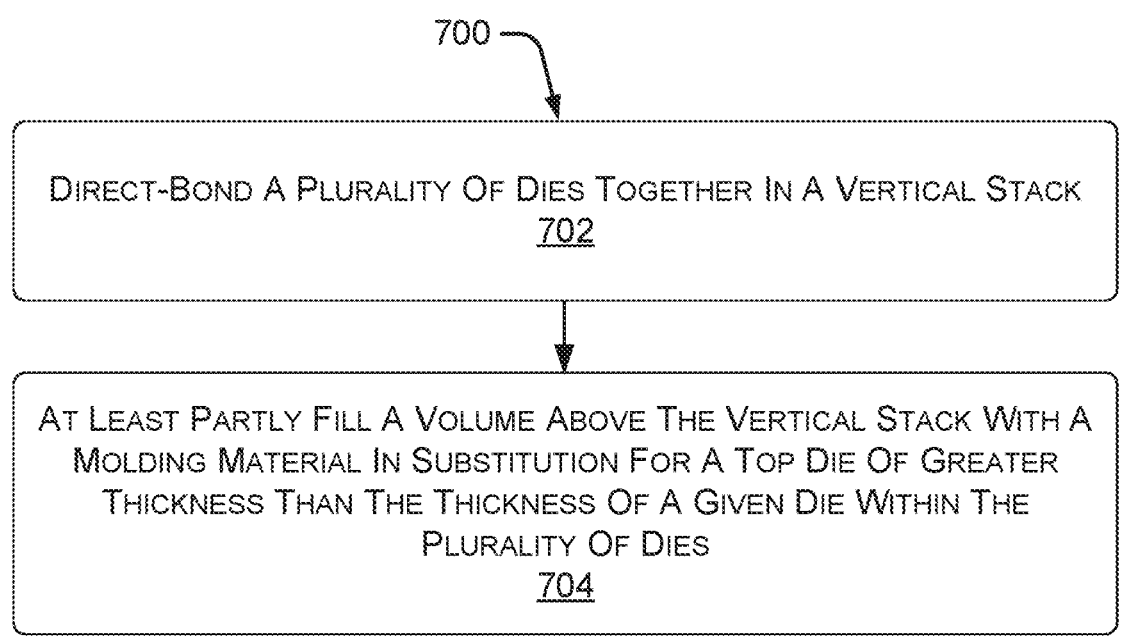
FIG. 7 is a flow diagram of an example process for fabricating the example module of FIG. 6.

FIG. 7 shows an example process 700 for fabricating the example module 600 of FIG. 6. Operations of the example process 700 are shown in individual blocks.

At block 702, the example process 700 includes direct bonding dies 102 together to make a vertical stack 602.

At block 704, molding material 604 is at least partly filled around the vertical stack 602 to substitute for the volume of the missing top die 106 and to complete the outer physical dimensions of the memory module 600 to specification. The thickness of the molding material 604 on top of the vertical stack 602 may be multiples of the thickness of an individual die 102 in the vertical stack 602. For example, the thickness of the molding material 604 may be 3 times the thickness of a die 102 in the vertical stack 602. One or more stress balancing layers may be added anywhere in or around the stack 602.

Figure 8:
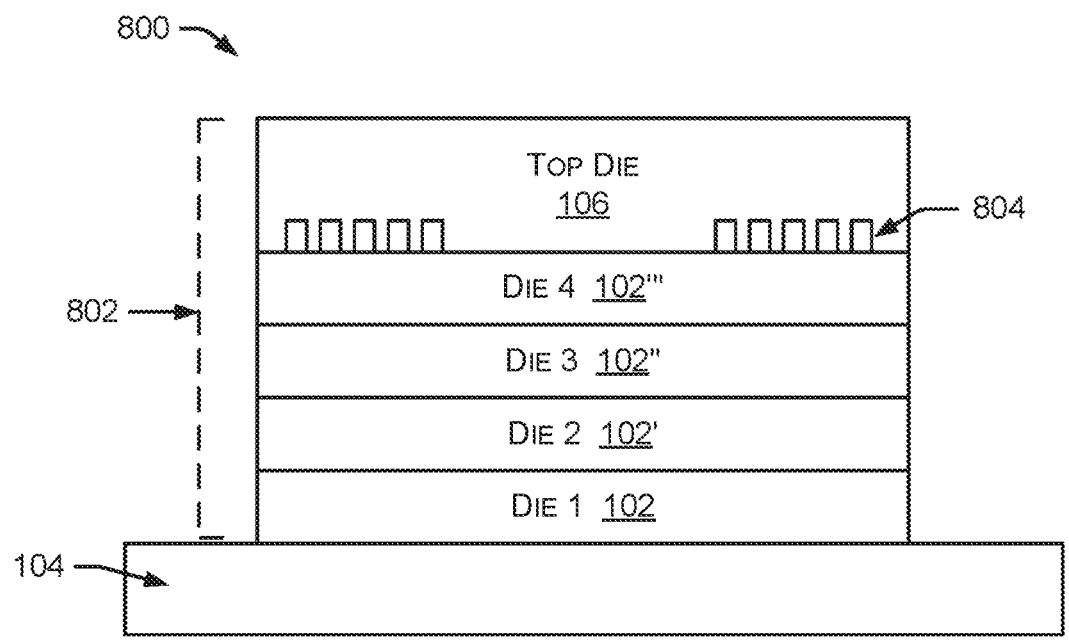
FIG. 8 is a diagram of an example module with a vertical die stack, including a relief cavity feature for alleviating a warpage stress in the vertical stack.

FIG. 8 shows as example module 800 with a die stack 802 that includes a relief cavity feature for alleviating a warpage stress in the vertical stack 802. In this example module 800, relief cavities 804 (not to scale) are made in the bonding surface of the top die 106 to relieve coupling forces between the top die 106 and at least the next die 102''' beneath the top die 106. An array of the relief cavities 804 may be placed where coupling forces are known or determined to be detrimental to the stability of the microelectronics package 800. If the top die 106 is an active die and part of the electronics of the memory module 800 (and not just a dummy die), then there may be metal interconnects, such as direct bonded interconnects, between the top die 106 and the next die 102''' beneath. Even though the metal interconnects may be rigid, the array of relief cavities 804 may still reduce and relieve coupling forces between the top die 106 and the vertical stack 802 to decrease the effect of warpage forces in the microelectronics package 800.

The example relief cavities 804 are typically formed in some portions of the dielectric regions between adjacent interconnects. In other applications, the relief cavities 804 may be formed between the interconnect portion and the edges on the die or singulation lanes. Also, the relief cavities 804 may be continuous or discontinuous and the geometrical profile of a relief cavity 804 may be triangular, rectangular or curvilinear. The depth of the relief cavities 804 may range between a few nanometers to a few microns. In an implementation, it is important that in the immediate region of the relief cavities 804, the bonding surface of the top die 106 is discontinuous from the surface of the die 102 beneath.

Figure 9:
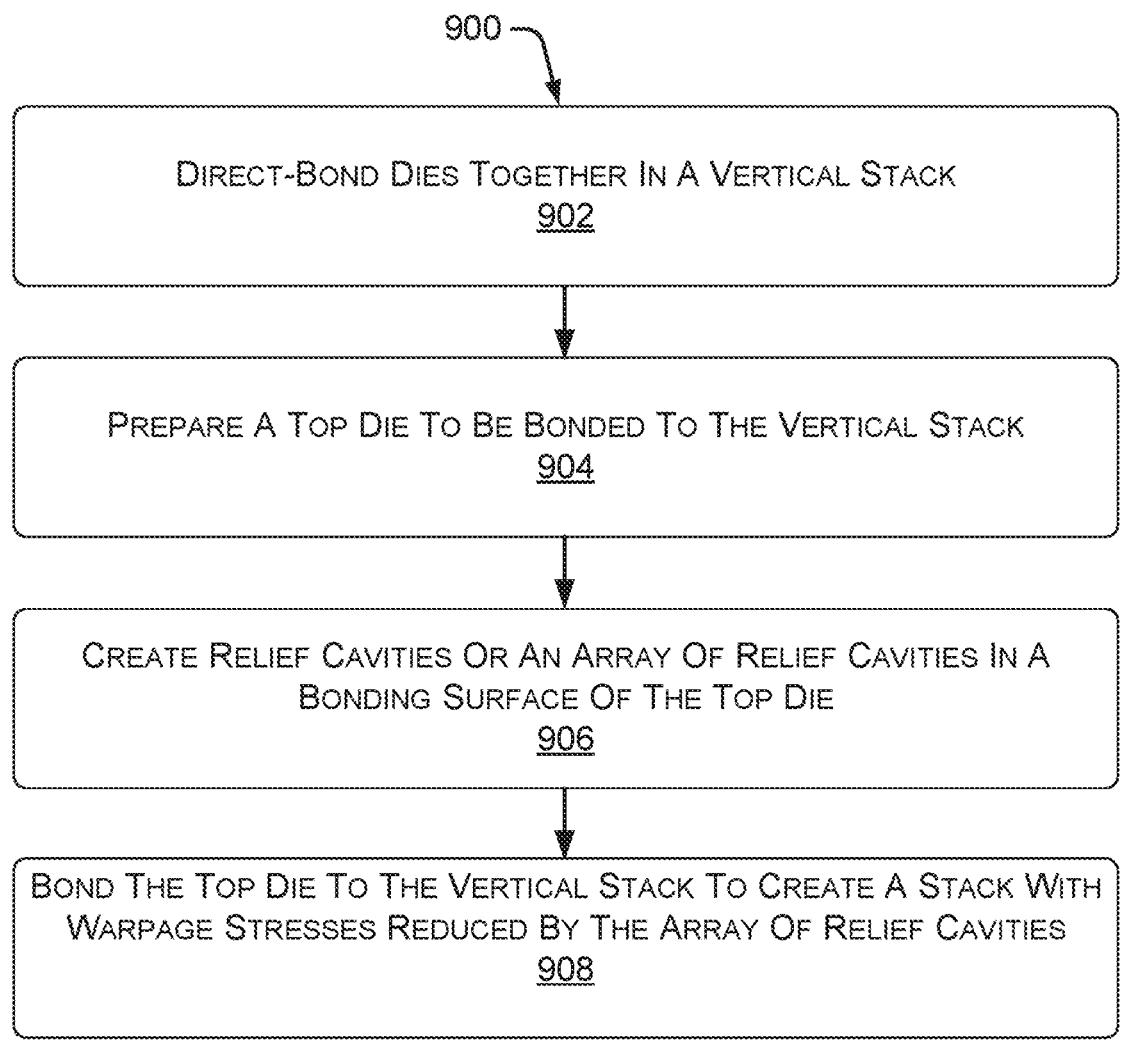
FIG. 9 is a flow diagram of an example process for fabricating the example module of FIG. 8.

FIG. 9 shows an example process 900 for fabricating the example module 800 of FIG. 8. Operations of the example process 900 are shown in individual blocks.

At block 902, the example process 900 includes direct bonding dies 102 together to make a vertical stack 802.

At block 904, the top die 106 is prepared for direct bonding to the vertical stack 802.

At block 906, relief cavities 804 are created in the top die 106.

At block 908, the top die 106 is bonded or direct bonded to the vertical stack 802 to create a microelectronics package 800 with warpage stresses alleviated between the top die 106 and the dies 102 of the vertical stack 802 to provide a more reliable package with reduced possibility of severe defects.

Figure 10:
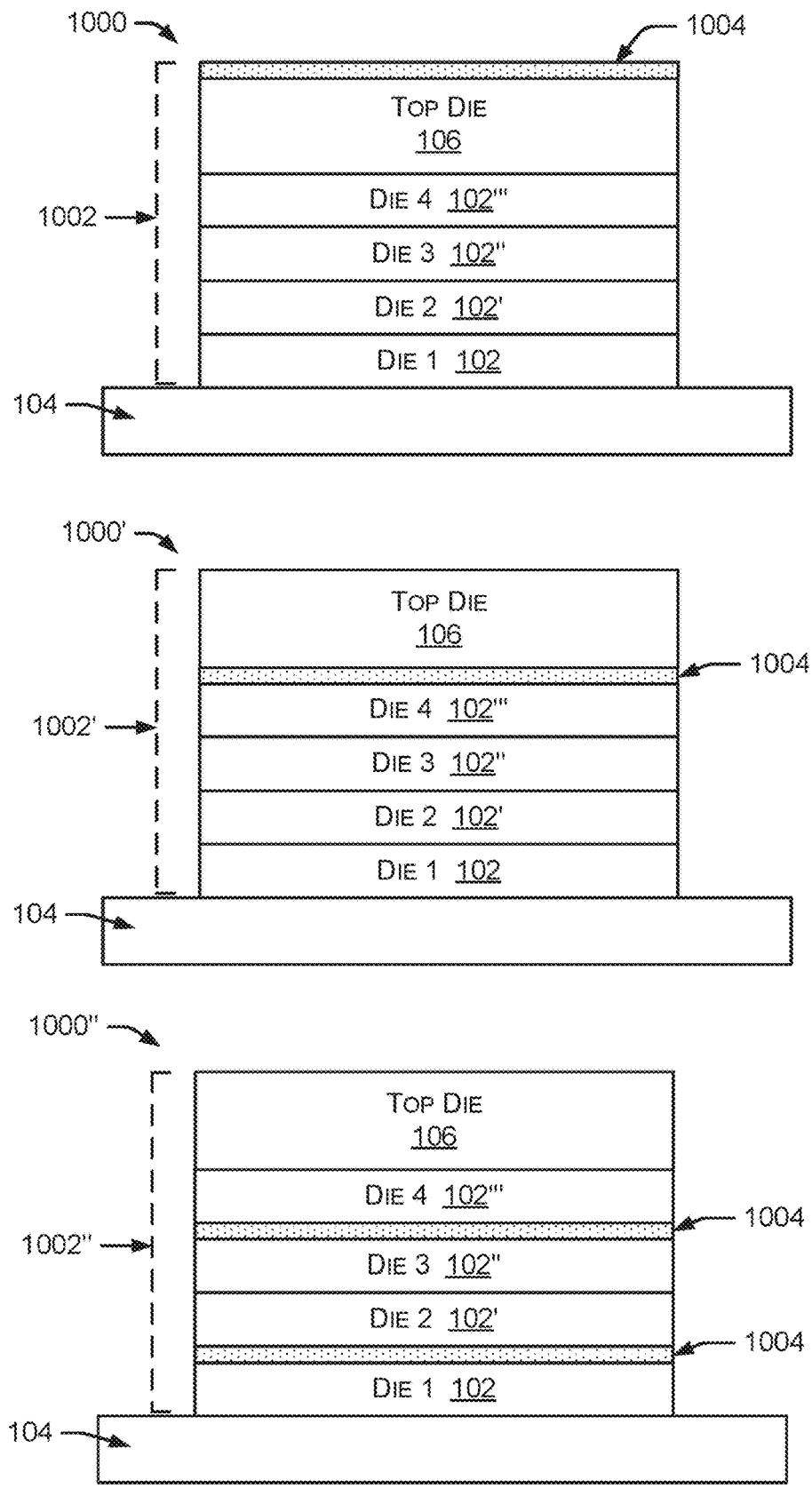
FIG. 10 is a diagram of an example module with a die stack that includes a stress balancing layer feature for alleviating a warpage stress in the vertical stack.

FIG. 10 shows as example memory module 1000 with a die stack 1002 that includes a feature for alleviating a warpage stress in the vertical stack 1002. In one example embodiment, a stress balancing layer 1004 is created on a backside of the top die 106 (topside of the vertical stack 1002 when the vertical stack 1002 includes the top die 106). The stress balancing layer 1004 may be made of a hard or firm material applied by physical vapor deposition (PVD) methods, for example, or by other application techniques to prevent warpage from occurring in the first place. The stress balancing layer 1004 may also be one or more firm materials to suppress or counteract the warpage of a die or stack, resulting from construction of the package 1000 or resulting from subsequent thermal changes during operation. The stress balancing layer 1004 may also be a layer that has a warp or camber of its own, designed to counter and cancel out the warpage or stress of a die or stack to which it will be adhered or bonded. The stress balancing layer 1004, in some configurations, can also redistribute stresses, balancing local stresses by horizontal redistribution of local warps and stress points with other local areas that have the opposite warp or stress, for a net zero overall warpage.

In some applications and structures 1000' the stress balancing layer 1004 may be coated on the lower side of the top die 106. In this arrangement, the stress balancing layer 1004 is disposed between the top die 106 and the bonded die immediately beneath the top die 106 in the stack 1002', such as die 4 102''' in structure 1000' of FIG. 10, for example.

In structure 1000", one or more stress balancing layers 1004 may be placed between the thin dies 102 in a die stack 1002", or anywhere in the stack 1002".

Such stress balancing layers 1004 can also be matched with each individual die 102 to be bonded into the stack 1002". Each stress balancing layer 1004 is designed to counteract a camber of a warped die 102 or stack 1002, with an opposite camber of its own. Thus, the stress balancing layer 1004 may apply a slight leaf spring action to the die or stack being unwarped. The opposing cambers cancel each other out when each stress balancing layer 1004 is mated to its warped die or stack, resulting in a flat stack 1002, or flatter stack 1002, ideally with a net overall warpage of zero.

In other embodiments, a stress balancing structure may comprise the stress balancing layer 1004 and a bonding layer, such as a distinct dielectric layer (not shown) and this bonding layer is disposed between the stress balancing layer 1004 and the bonded die immediately beneath, such as die 4 102" in FIG. 10, for example. In some applications, the dielectric bonding layer may be a thin adhesive layer and the thickness of the adhesive layer is substantially thinner than one of the bonded dies 102.

In an implementation, an example stress balancing layer 1004 can be made of one or more conductive layers, for example, an example stress balancing layer 1004 may be made of titanium nitride and/or tantalum (TiN/Ta), or Ta and Al as co-evaporated or co-sputtered layers, or these metals may be deposited sequentially over each other. But the example stress balancing layer 1004 is not limited to these compounds and elements. Multiple stress balancing layers 1004 may be applied and may have different coefficients of thermal expansion (CTEs) to provide different balancing force differentials at different temperatures. Moreover, a bonding layer, such as an oxide, nitride, or similar material may be formed on the stress balancing layer to enable direct or hybrid bonding to another surface. When the stress balancing layer 1004 is a nonconductor, the stress balancing layer 1004 may be able to accommodate vertical conductors, such as TSVs and/or metal interconnects transiting through a thickness of the stress balancing layer 1004.

In an implementation, the stress balancing layer 1004 can be made of a photopatterned polymer, which assembles or has a tendency to assemble into a curved geometry. A differentially photo-crosslinked SU-8 photoresist film, for example, may curve upon photolithographic patterning. In another implementation, a polymeric thin film with heterogeneous mechanical properties makes a curved or leaf spring stress balancing layer 1004 to be bonded to a warped die.

Figure 11:
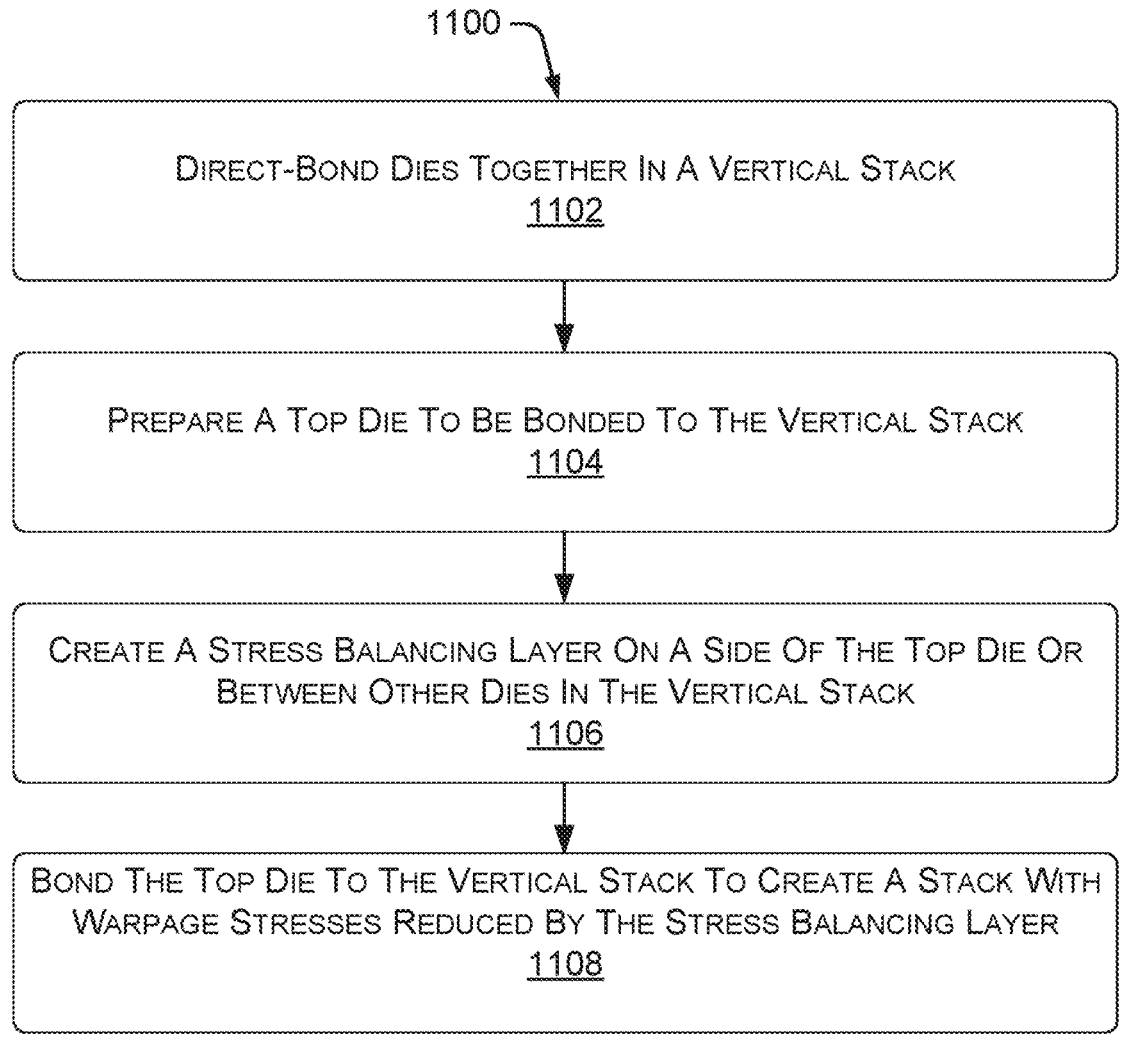
FIG. 11 is a flow diagram of an example process for fabricating the example module of FIG. 10.

FIG. 11 shows an example process 1100 for fabricating the example module 1000 of FIG. 10 including one or more stress balancing layers 1004. Operations of the example process 1100 are shown in individual blocks.

At block 1102, the example process 1100 includes direct bonding dies 102 together to make a vertical stack 1002 of the dies 102.

At block 1104, a top die 106 is prepared for direct bonding with the vertical stack 1002.

At block 1106, the top die 106 is associated with a stress balancing layer 1004. In one example process, the top die 106 is pre-coated with the stress balancing layer 1004 prior to its attachment to the vertical stack 1002. After the attachment step, the new stack may be processed further, for example, undergoing thermal annealing or molding operations.

At block 1108, the top die 106 and stress balancing layer 1004 are bonded to the dies 102 in the vertical stack 1002.

In a variation of the example process 1100, one or more stress balancing layers 1004 are placed anywhere in a stack of dies to balance stresses or cancel warpages of a die, a group of dies, or an entire stack of dies.

Figure 12:
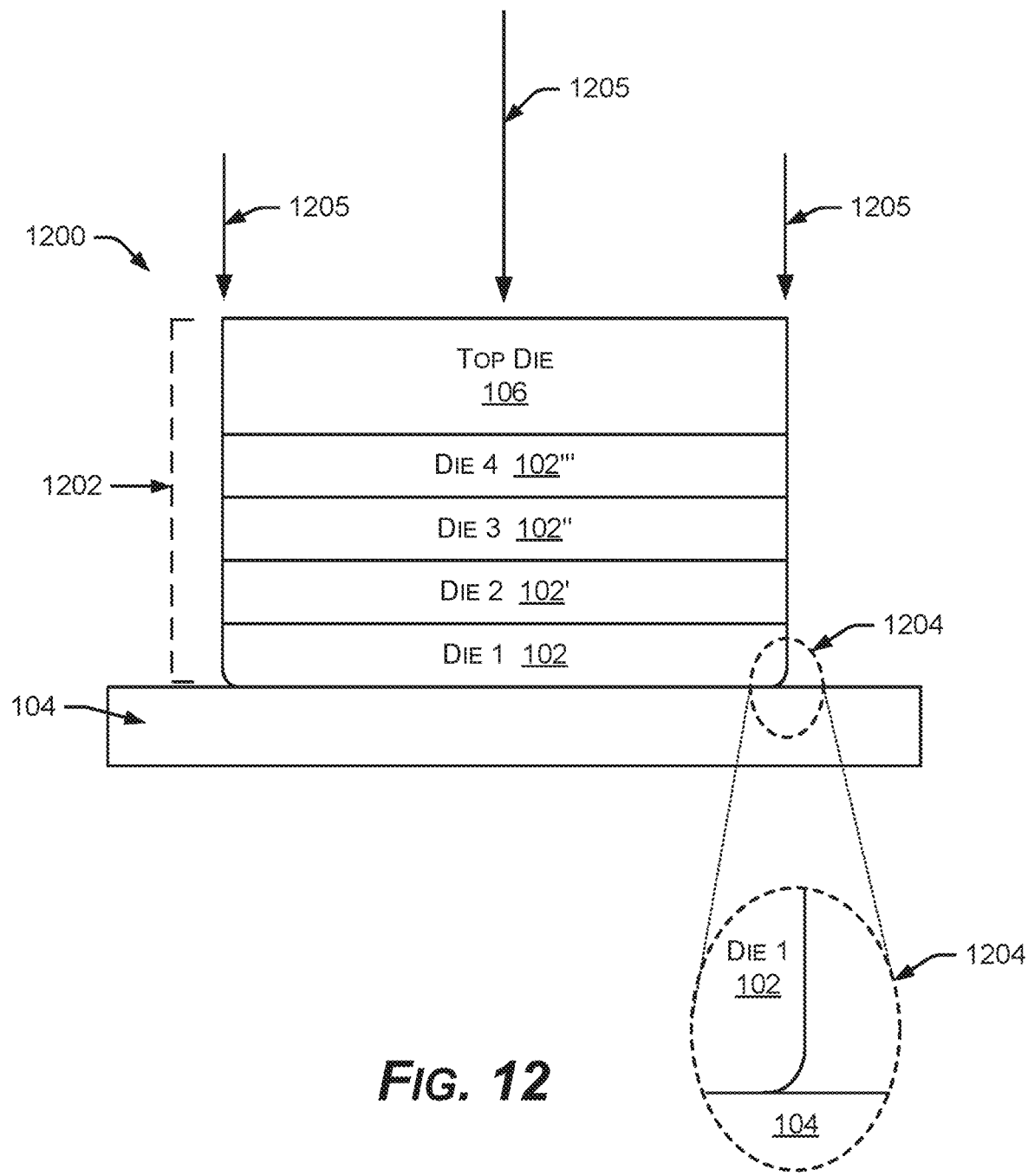
FIG. 12 is a diagram of an example module of vertically stacked dies with at least some rounded corners or edges to prevent stress concentration at corners.

FIG. 12 shows a memory module 1200 of vertically stacked dies 102 direct bonded together. Right-angle corners 1204 of some dies 102 in the stack 1202 can be rounded in the x-, y-, and/or z-directions to prevent stress concentration: a concentration of pressing forces 1205 at the conventionally squared corners 1204 of the dies 102 during stack fabrication. The pressing forces 1205 can conventionally crack and chip the fragile dies, or the substrate 104, below the 90 degree corners. Rounding, chamfering, or otherwise casing the typically sharp 90 degree corners or the edges between the z-plane and the x/y-planes can prevent or disperse transmission of the concentrated pressing forces 1205 to the relatively fragile and brittle dies, or the substrate 104, beneath. In one embodiment, the edges of the bonded dies 102 of stack 1202 are rounded to prevent point stresses at corners 1204. In other applications, the edges of the top die 106 may also be rounded.

Figure 13:
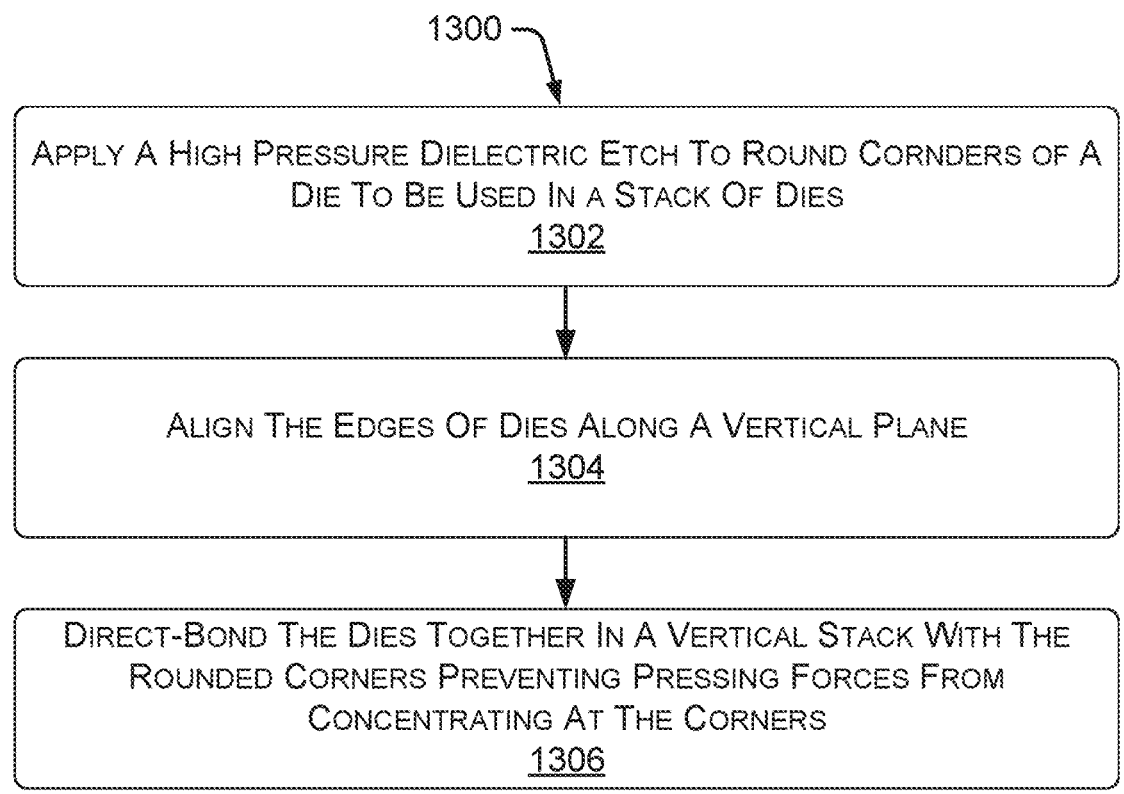
FIG. 13 is a flow diagram of an example process for preventing concentration of damaging forces in fabrication of a vertical stack of dies.

FIG. 13 shows an example process 1300 for preventing concentration of damaging forces in fabrication of a vertical stack of dies 1202. Operations of the example process 1300 are shown in individual blocks.

At block 1302, the example process 1300 includes rounding right-angle corners of selected dies to be made into the vertical stack of dies 1202. The corner-rounding can be achieved, for example, by applying a high pressure dielectric etch during a plasma etching operation. The etching operation may comprise etching the substrate 104 and coated dielectric layers. In other cases, the edges of the dielectric of the bonding surface need to be rounded prior to the bonding operation. In some applications, the boding surface may be shielded with a protectant and the selected edges may be rounded by wet etching methods or by mild abrasive powder blasting operations, or by laser jet methods or combinations thereof. The dies 102 to be used in the stack 1202 are then lined up according to a vertical plane. The dies 102 with at least some rounded corners 1204 are direct bonded together into a stack 1202, with the rounded corners 1204 preventing pressing forces from concentration at the corners 1204 and also preventing these forces from being transmitted to break, crack, or chip the next die or substrate 104 below.

Figure 14:
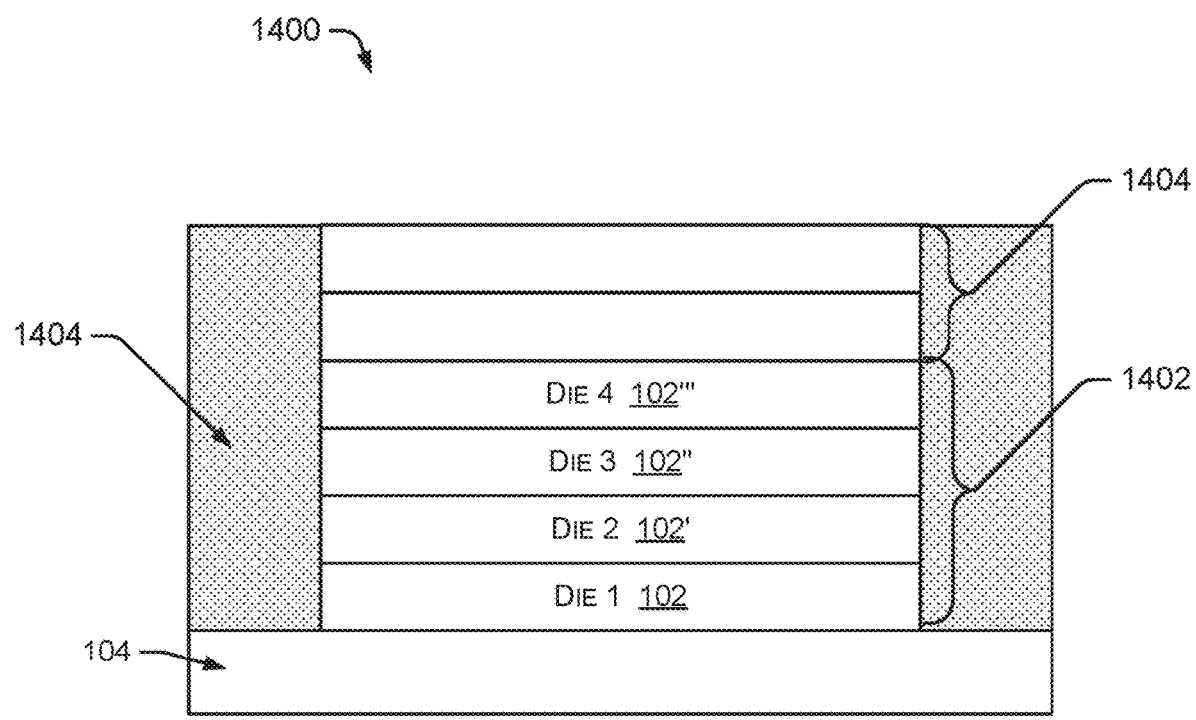
FIG. 14 is a diagram of an example module with multiple thin dies substituting for a large die to reduce stress warpage in a die stack.

FIG. 14 shows another example module 1400, memory module, or other stacked device, constructed according to one or more techniques for reducing stress warpage in the die stack 1402 making up the module 1400. In this implementation, instead of using a large monolithic die on top of the die stack 1402, two or more thinner dies 1404 are bonded on top of the stack 1402 of smaller dies 102. These thinner dies 1404 on top either conform to the stack below 1402 or can impose a counter-warpage to that of the warpage of the stack 1402 underneath. In some arrangements, a molding material 1406 laterally surrounds the bonded die stack 1402.

Figure 15:
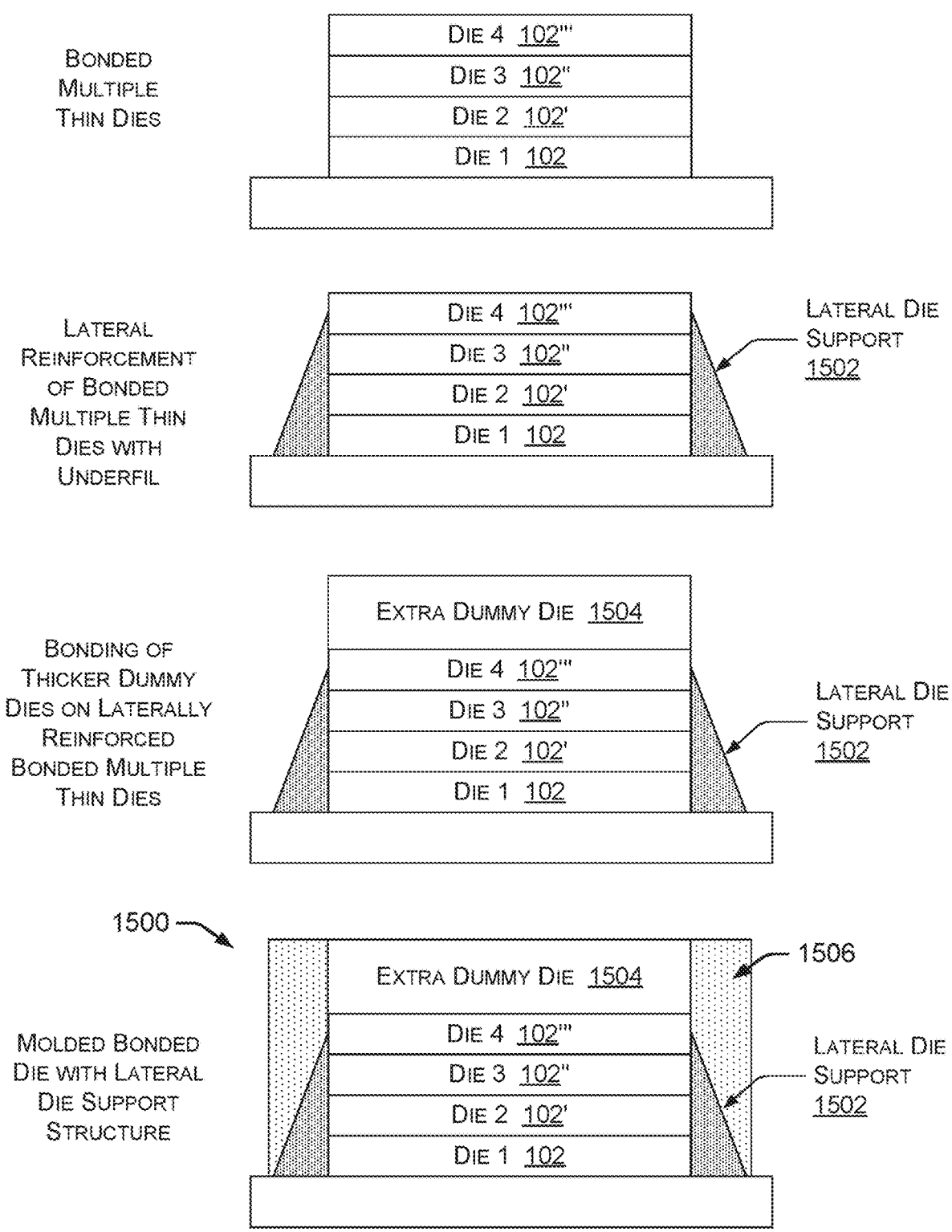
FIG. 15 is a diagram of an example structure including a lateral support for eliminating warpage problems and increasing yield in fabrication of modules with vertical die stacks.

FIG. 15 shows another example structure 1500 for eliminating warpage problems and reduced yield in fabrication of modules, such as memory modules and other devices with stacked dies.

A stack of the dies 102 are provided with a lateral support 1502, such as side buttresses made of underfill material or another firm solid or particulate composite layer. Since the individual dies 102 can be very thin, such as 55 µm in thickness or even thinner, they may be prone to warping. Before a thick top die 1504 is bonded to the stack, the lateral supports 1502 are built against the sides of the stack. These one or more lateral die support structures 1502 may be formed by various dispensing methods including printing or molding methods. During direct bonding of a top dummy die 1504 (or active die) to the stack of dies 102, for example, the lateral supports 1502 hold the edges of the dies and also stabilize the stack of dies 102 as a whole. A lateral support structure 1502 also reduces incidences of damage to the bonded dies from routine handling operations. This results in a finished module, in which the various dies 102 and 1504 are less prone to chipping or cracking on account of the solid stabilization of the lateral supports 1502. Side molding 1506 may also be added to further stabilize the stack 102 & 1504 and complete the package. It is of note that the lateral support structure 1502 abuts the periphery of the bonded dies 102 and not that of the top die 1504. Also, the side molding 1506 is disposed around the bonded dies 102 and the top die 1504, but the side molding 1506 is not in direct contact with the lower dies 102 of the stacked bonded dies, such as die "1" 102 and die "2" 102', for example. Thus, the side molding 1506 directly abuts only some portions of the bonded dies in the bonded dies stack.

Figure 16:
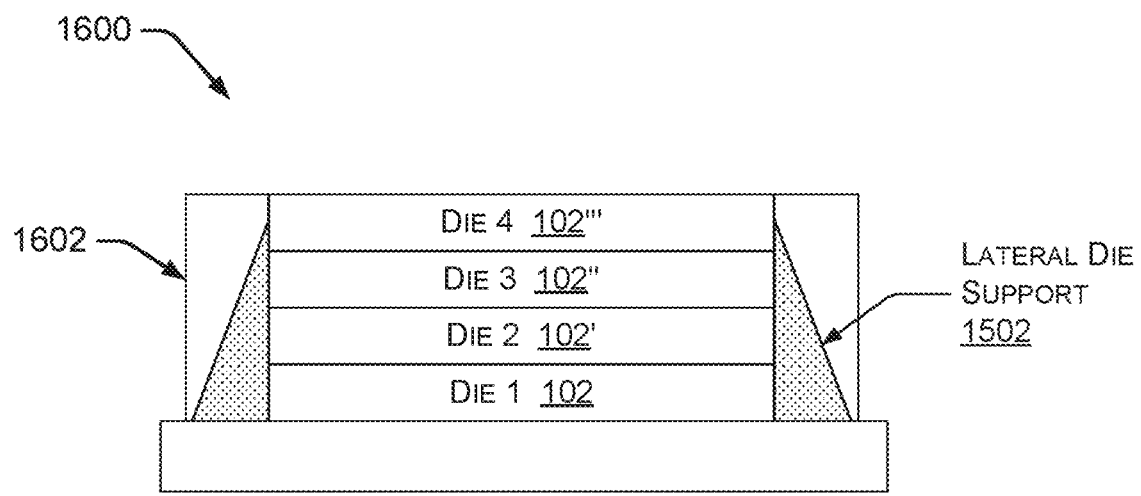
FIG. 16 is a diagram of an example structure with no top die spacer, and with lateral support structures and molding, for reducing interior stresses.

FIG. 16 shows an implementation of a structure 1600 similar to the structure 1500 of FIG. 15, but the example module 1600 does not use a top extra die 1504. In this case, side molding 1602 may be used after the lateral supports 1502 are placed, in order to complete a shorter package 1600. As described earlier, the side molding 1602 directly abuts some portions of the topmost die or dies, and not the other bonded dies in the bonded dies stack. In one embodiment, the side molding 1602 does not directly contact the stacked bonded dies.

Figure 17:
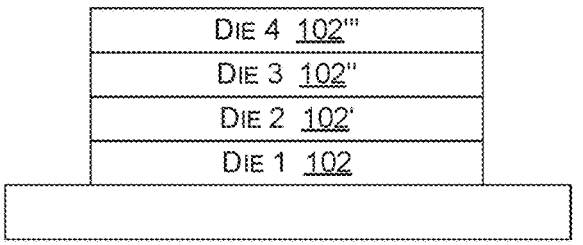
FIG. 17 is a diagram of example structures formed in a process that uses temperature differentials to reduce warpage stresses during fabrication of vertical stacks of dies.
Figure 17:
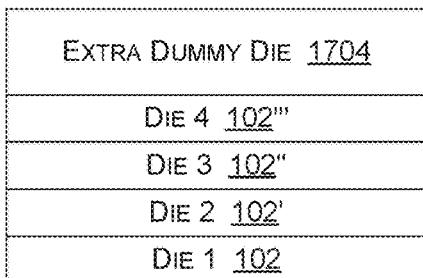
Figure 17:
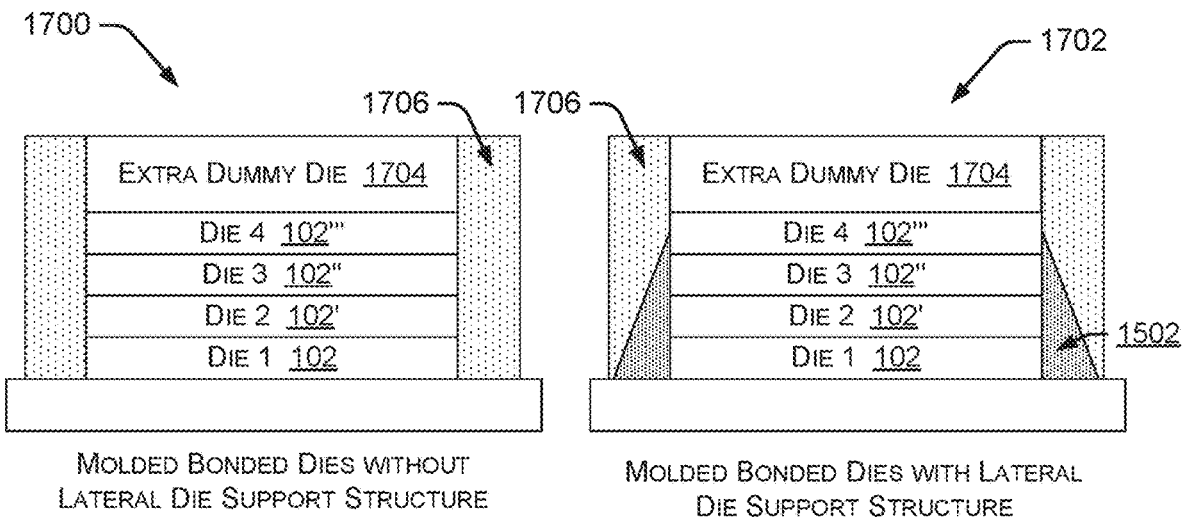

FIG. 17 shows additional example structures 1700 & 1702 for creating modules with stacked dies 102 while reducing stress warpage when the dies 102 are direct bonded in a stack. The example technique also applies when an extra dummy die 1704 is direct bonded on top of the respective stacks with a concavity of warpage that may be different from that of the stack of dies 102 beneath it.

First, in an example process, multiple thin dies 102 are direct bonded together at a first temperature, for example in the approximate range of 140-350° C. The top die, the extra dummy die 1704, is then bonded to the stack of dies 102 at a second temperature preferably lower than the first temperature. In one embodiment, for example, the multiple thin dies 102 may be bonded at a temperature sufficiently high for a metallic bond to form between mating metallic electric contacts between intimately mated dies. For example, the mating temperature for the opposing electrical and non-electrical contacts may range between 150-300° C., and preferably between 180-250° C. for a time duration ranging from 45 minutes to 2-4 hours or even longer. The bonding temperature depends on the nature of the mating metal layer. In practice, the higher the bonding temperature, the shorter the bonding times and vice versa.

The stack of dies 102 is allowed to cool to the lower bonding temperature for additional processing if needed before attaching the top extra dummy die 1704 to the upper surface of the last die in the stack of dies 102. The attached dummy die 1704 is then bonded at a temperature preferably lower than the metallic mating temperature of the bonded stacked dies. In one embodiment, the dummy die 1704 is bonded at temperatures ranging from below room temperature to below 130° C., and preferably below 100° C. Reducing the bonding temperature of the top die 1704 reduces the stress transmitted from the die 1704 to bonded dies beneath, such as in example stacks 602 (FIG. 6), stack 1402 (FIG. 14), and stack 1801 (FIG. 18).

In one implementation, the warpage state of the stack of dies 102 direct bonded at the higher temperature and then cooler to the lower temperature is memorialized and "fixed" by adding a lateral support 1502 of underfill or other solid material to stabilize the stack. In another implementation, the package is stabilized and/or completed with molding material 1706 on sides as needed.

Figure 18:
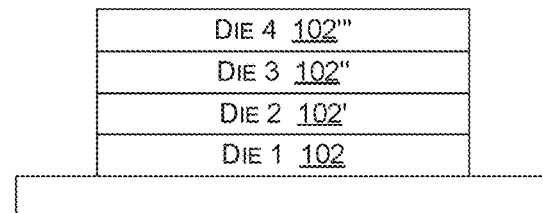
FIG. 18 is a diagram of example structures and associated processes for making an example module of stacked dies by uniting multiple pre-made stacks of dies, while reducing interior stress warpage.
Figure 18:
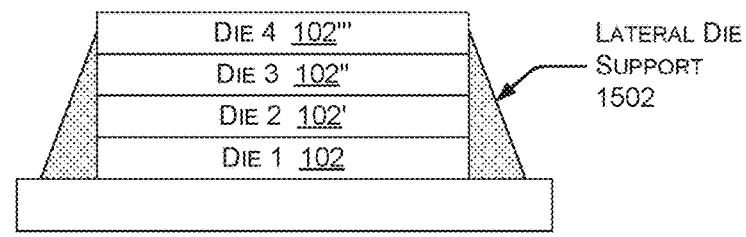
Figure 18:
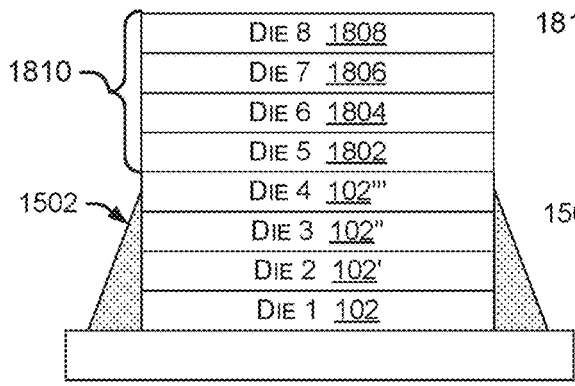
Figure 18:
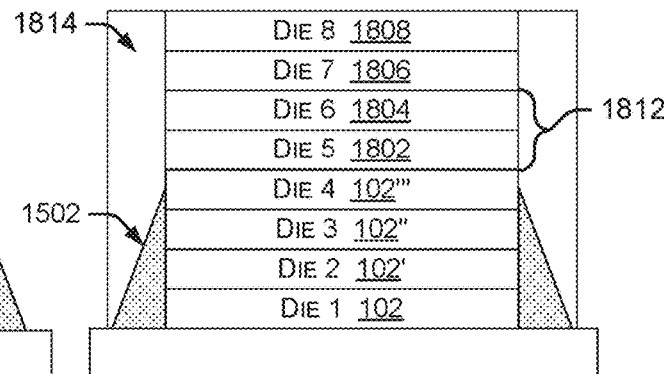

FIG. 18 shows example structures and associated processes for making an example module 1800 of stacked dies that has reduced interior stress warpage and/or a higher manufacturing yield due to less failure from warpage during fabrication. A first stack of dies 1801 is assembled by direct bonding thin dies 102 to each other, or by other bonding means. Underfill or other solid material is used to make lateral supports 1502 for the stack of dies 102, thereby stabilizing the stack of dies 102 in a non-warped state.

Another stack 1810 of dies 1802 & 1804 & 1806 & 1808 are made separately, applying one or more of the anti-warping measures as described herein. This pre-made stack 1810 of additional dies is then bonded or direct bonded to the initial stack of dies 102, rather than just continuing the initial single stack 102 by adding the individual additional dies 1802 & 1804 & 1806 & 1808 one-by-one, which would propagate and further exaggerate the negative warpage of the initial stack of dies 102.

In an implementation, a layer 1812 topping the initial stack of dies 102, which would be an extra dummy die in conventional modules to fill out the package, is made of active dies 1802 & 1804 in this implementation of the microelectronic device or module 1800 being assembled, these dies 1802 & 1804 are not dummy dies. The module 1800, now containing two stacks of dies 102 & 1810 direct bonded together, can be filled out and completed with a molding material 1814.

It should be noted that in one implementation, the lateral supports 1502 made of underfill material, for example, represent a first encapsulation that touches, supports and stabilizes only the dies 102 of the first stack of dies 102, while the molding material 1814 added later represents a second encapsulation that touches, supports, and stabilizes only the dies of the second stack 1810. Thus all dies in the two stacks 102 and 1810 get stabilized in a non-warped configuration by encapsulants, but in a different manner for each of the stacks as the module 1800 is assembled. The first stack of dies 102 receives lateral supports 1502 from a buttressing underfill material, while the next stack of dies 1810 receives non-warp stabilization from side molding 1814 that completes the package.

Figure 19:
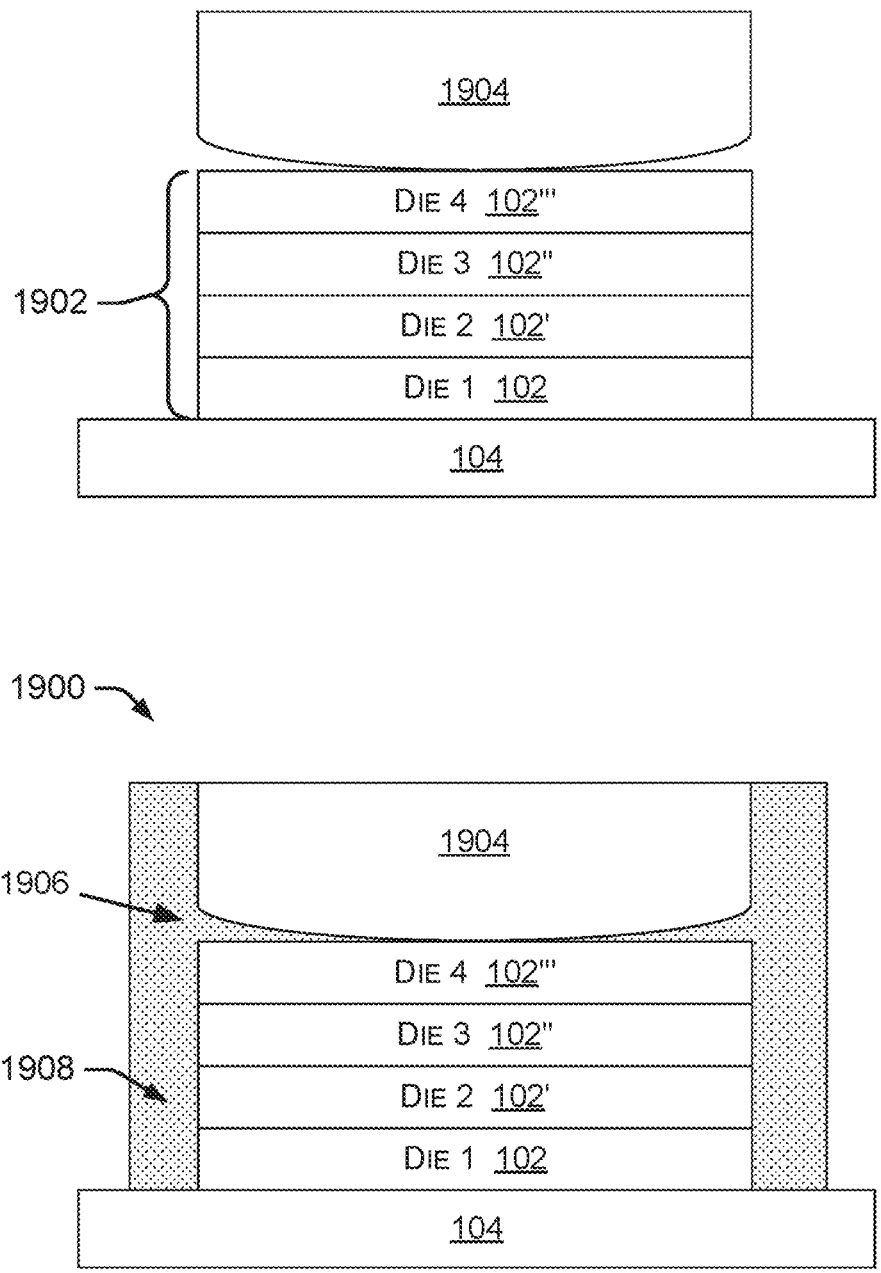
FIG. 19 is a diagram of an example structure with features for alleviating warpage stresses in stacks of dies, including rounded die corners supported by an encapsulant fillet or wedge.

FIG. 19 shows another example structure 1900 and method for alleviating warpage stresses in stacks of dies and microchips, especially when the dies are very thin. An example module 1900 with a stack 1902 of dies 102 is built on a substrate 104, such as a semiconductor wafer, carrier, panel, or interposer, etc.

In an implementation, a top die 1904 is added to the stack of dies 102 to bring the package to a height specification. The top die 1904 may be a dummy die, but can also be one or more active dies. In an implementation, the top die 1904 is thicker than the individual dies 102 making up the stack 1902 beneath it, and so is subject to warping in its own right. The bonding surface of the top die 1904 may be formed by photolithographic and selective material methods. In one example, the bonding surface of die 1904 may be selectively protected with an organic or inorganic resist protective layer for example. The unprotected portion of the bond surface may be etched by a dry or a wet method to remove sufficient materials to prevent the etched regions from contacting the top bonding surface of the die 102 immediately beneath during and after the bonding operation.

After the material removal step on die 1904, the protective layer is stripped, the bottom bonding surface of the top dies is cleaned, prepared and bonded to the top surface of die 102. The top die 1904 may be imparted with rounded edges on its bonding side proactively. The top die 1904 is direct bonded to the stack of dies beneath it at its middle region forming a peripheral gap beyond the bonded region. In this configuration, the prepared bonding surface of the top die 1904 is smaller than the bonding surface of die 102 beneath. Reducing the bonded area between top die 1904 and the die beneath, for example die "4" 102''', reduces the force transmitted to the bonded dies beneath. In one embodiment, an encapsulant wedge or fillet 1906 may be applied to fill the peripheral gap beyond the bonded region of die 1904. The encapsulant fillet 1906 may comprise or incorporate a particulate material to reduce the thermal expansion of the encapsulant material. In other embodiments, underfill material or a molding material 1908 may be applied to encapsulate the bonded dies, such as dies 102 and die 1904, and to fill the fillet 1906 between the top die 1904 and the die 102''' beneath.

The encapsulating material 1908 firmly couples the bonded dies stack 102 and the top die 1904 to form an integrated solid structure and also acts as a protective layer thereby preventing stress cracking and delamination between the stack of dies 102 and the top die 1904. The fillet 1906 of compliant material may also be the same material as the molding 1908 around the sides of the stack 102 & 1904, which completes the package 1900.

Figure 20:
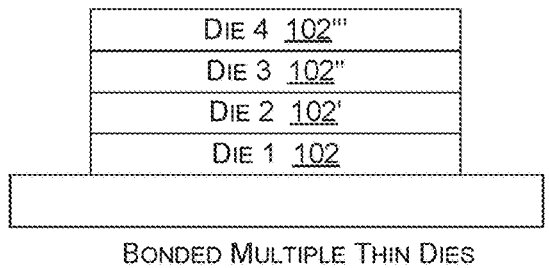
FIG. 20 is a diagram of example structures for constructing larger modules that have numerous stacked dies, without introducing problems caused by stress warpage.
Figure 20:
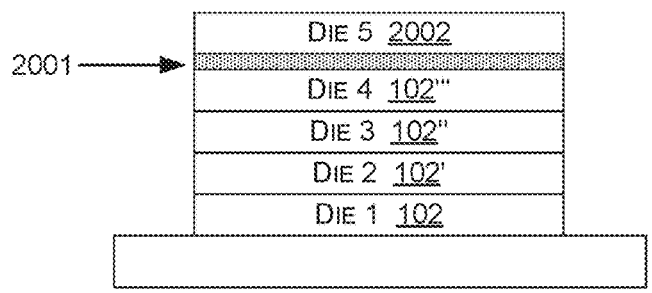
Figure 20:
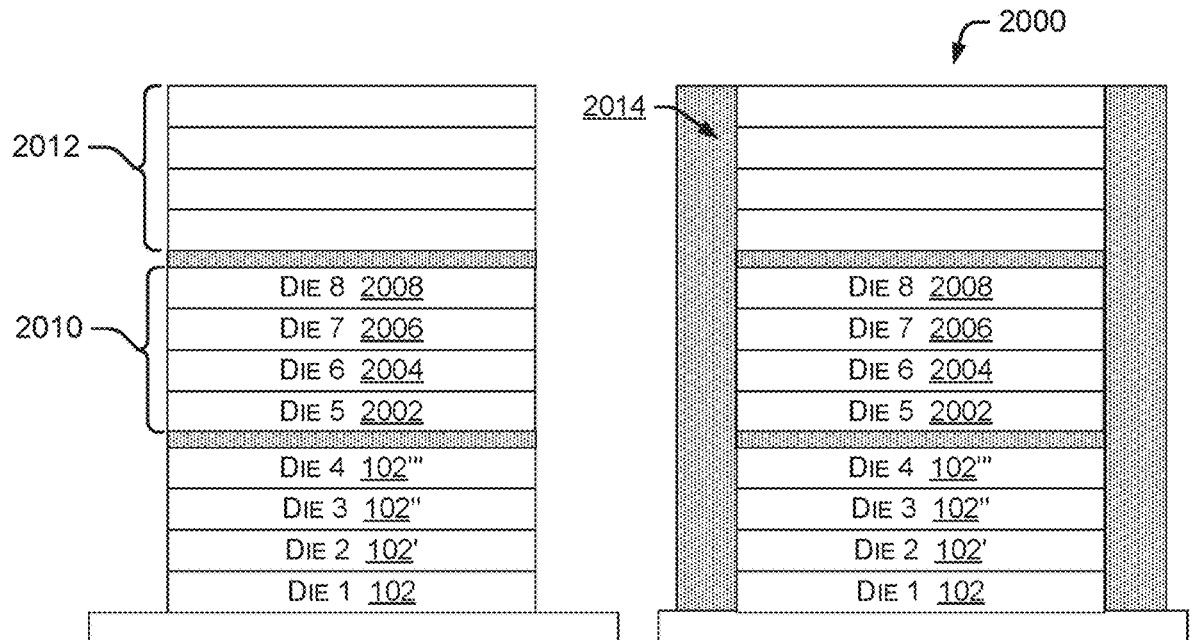

FIG. 20 shows another example scheme for constructing larger modules 2000 that have numerous stacked dies, without introducing problems caused by stress warpage, which decrease yield during fabrication. In this embodiment, a compliant layer 2001 is added at intervals, between groups of dies, such as between a first group of dies 102, a second group 2010 of dies 2002 & 2004 & 2006 & 2008, and a third group 2012 of active or dummy dies. In one embodiment, the compliant layer 2001 comprises one or more conductive vias for electrically connecting conductive features on the backside of die "4" 102''' to the conductive features of die "5" 2002. In some applications, the layer 2001 may comprise one or more low melting point conductive materials (for example solder) for connecting desirable portions of die "4" 102''' to similar portions in die "5" 2002.

In an implementation the dies 102 and compliant layers 2001 are stacked up individually, one die 102 or layer 2001 at a time, by direct bonding or direct hybrid bonding, for example. In another implementation, the groups of dies 102 & 2010 & 2012 are constructed separately, and groups of dies are added to the overall stack as grouped units.

When the overall stack of dies 102 & 2010 & 2012 is completed, the stack may be encapsulated with molding 2014 or the same compliant material as used in the compliant layers 2001.

Figure 21:
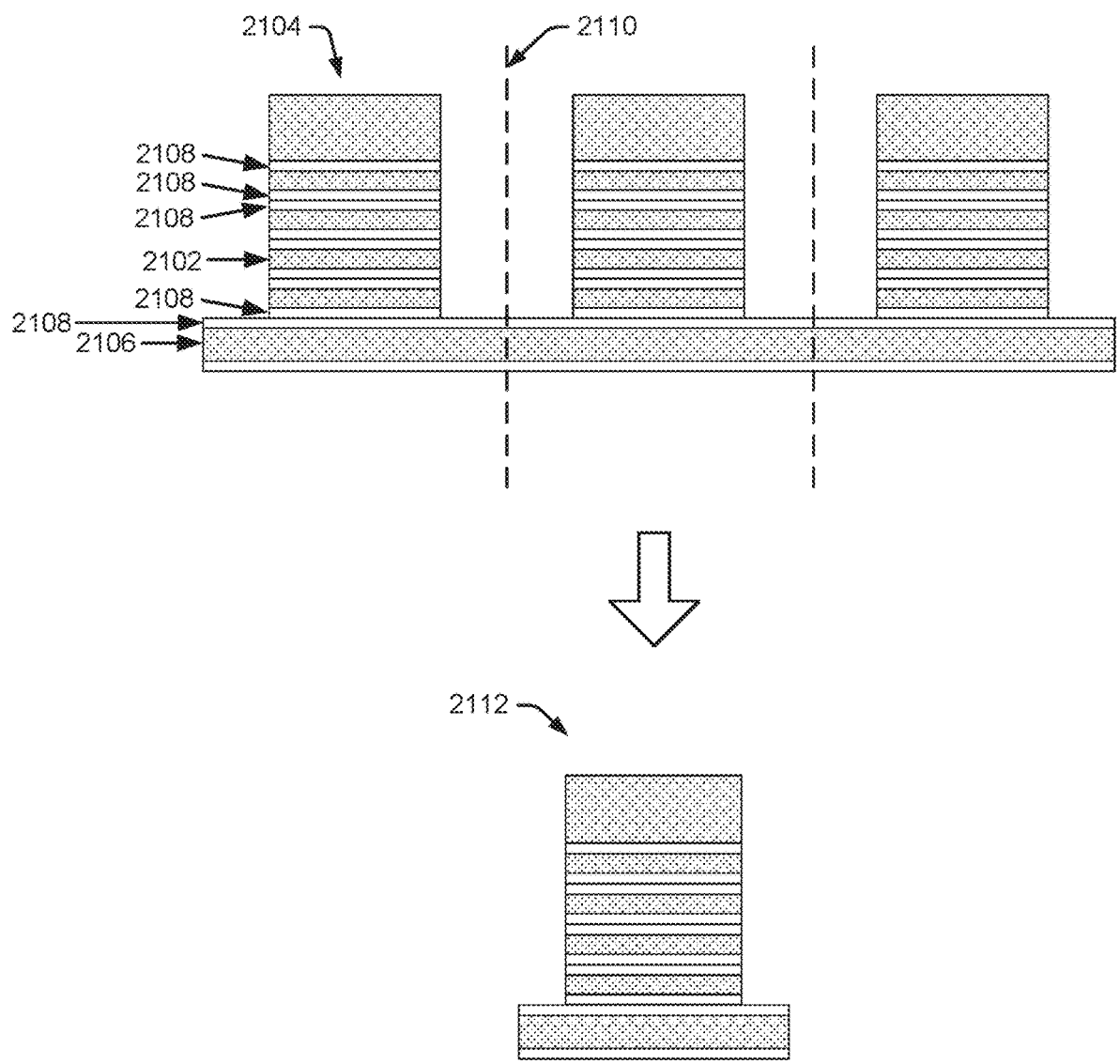
FIG. 21 is a diagram of example structures including thin layers of dielectric material and features for reducing interior stresses.

FIG. 21 shows thin dies 2102 direct hybrid-bonded together into stacks 2104. Each stack 2104 is built on a common wafer substrate 2106, for example, or carrier, panel, etc. Thin layers of dielectric and metal 2108 (direct hybrid bonding layers 2108) on the dies 2102 and substrate 2106 enable the direct hybrid bonding. That is, the bonding layer 2108 may consist of multiple layers, and/or may consist of a combination of dielectric material(s) and metal(s). The dielectric may consist of multilayer dielectrics including but not limited to diffusion barrier layers and dielectric layers for bonding which consist of Si, O, N, and C. Additionally, layer 2108 may also contain metal materials as conductive pads, wherein the direct bonding occurs at the dielectric surfaces followed by direct bonding between metal bonding pads, vias, and interconnects of the dies 2102 in an annealing step of the same overall direct bonding operation. One or more extra dummy dies on top of each stack 2104 may be direct bonded to each respective stack 2104 with oxide-oxide direct bonding.

A singulation operation 2110 dices individual stacks 2104 into individual module units 2112, such as individual high bandwidth memory modules.

Figure 22:
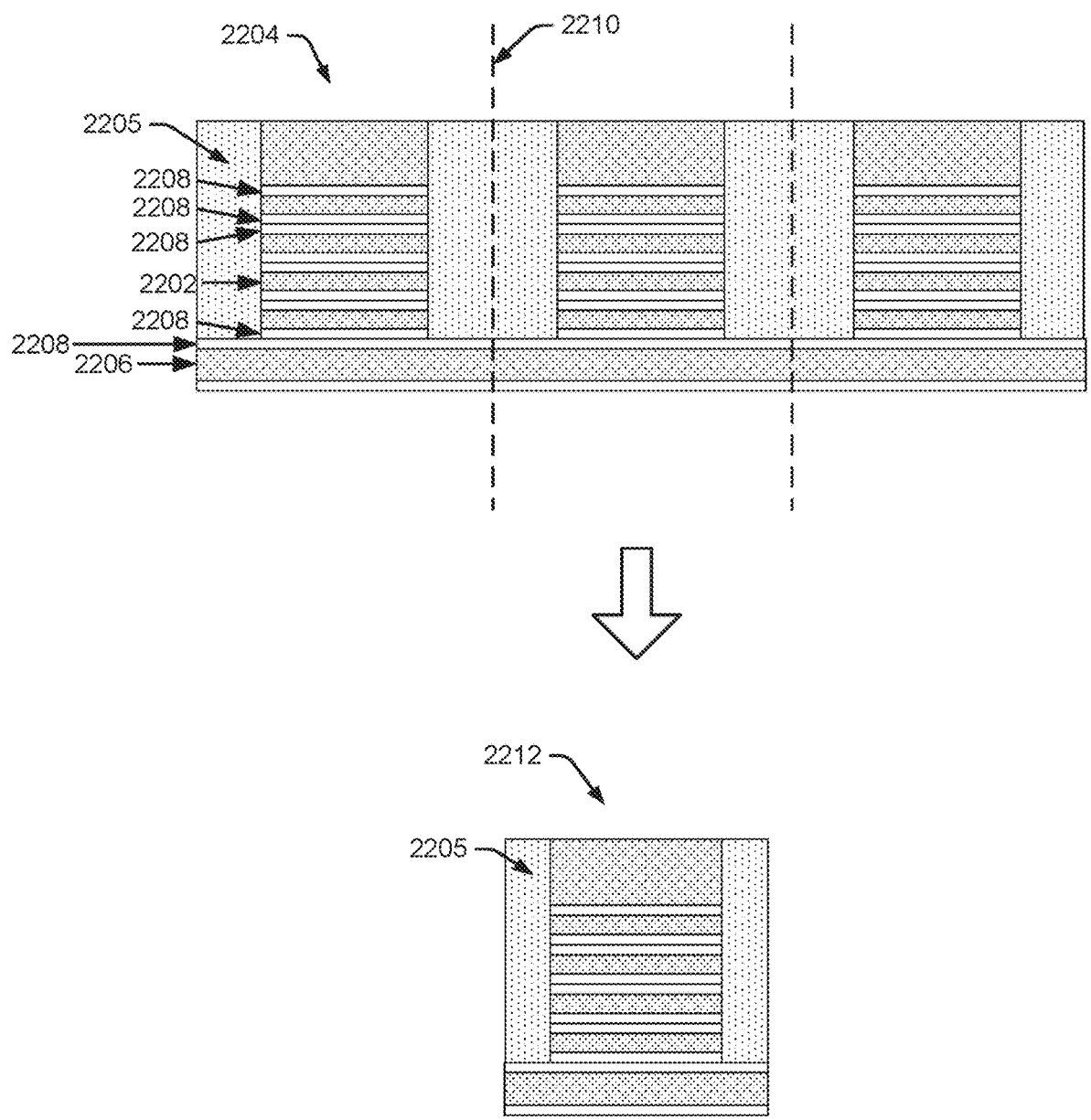
FIG. 22 is another diagram of example structures possible that include features for reducing interior stresses.

FIG. 22 shows thin dies 2202 direct hybrid bonded together into stacks 2204 and encapsulated with a molding material 2205. Each stack 2204 is built on a common wafer substrate 2206, carrier, panel, etc. Direct hybrid bonding layer 2208 consists of extremely thin layers of dielectric 2208 on the dies 2202 and substrate 2206 to enable the direct hybrid bonding. Thin layers 2208 of dielectric and metal (direct hybrid bonding layer 2108) on the dies 2202 and substrate 2206 enable the direct hybrid bonding. The bonding layer 2208 may consist of multiple layers, and/or may consist of a combination of dielectric material(s) and metal(s). The dielectric may consist of multilayer dielectrics including but not limited to diffusion barrier layers and dielectric layers for bonding which consist of Si, O, N, and C. Additionally, layer 2208 may also contain metal materials as conductive pads, wherein the direct bonding occurs at the dielectric surfaces followed by direct bonding between metal bonding pads, vias, and interconnects of the dies 2202 in an annealing step of the same overall direct bonding operation. One or more extra dummy dies on top of each stack 2204 may be direct bonded to each respective stack 2204 with oxide-oxide direct bonding, for example.

A singulation operation 2210 dices individual stacks 2204 into individual module units 2212 that are pre-encapsulated 2205.

Figure 23:
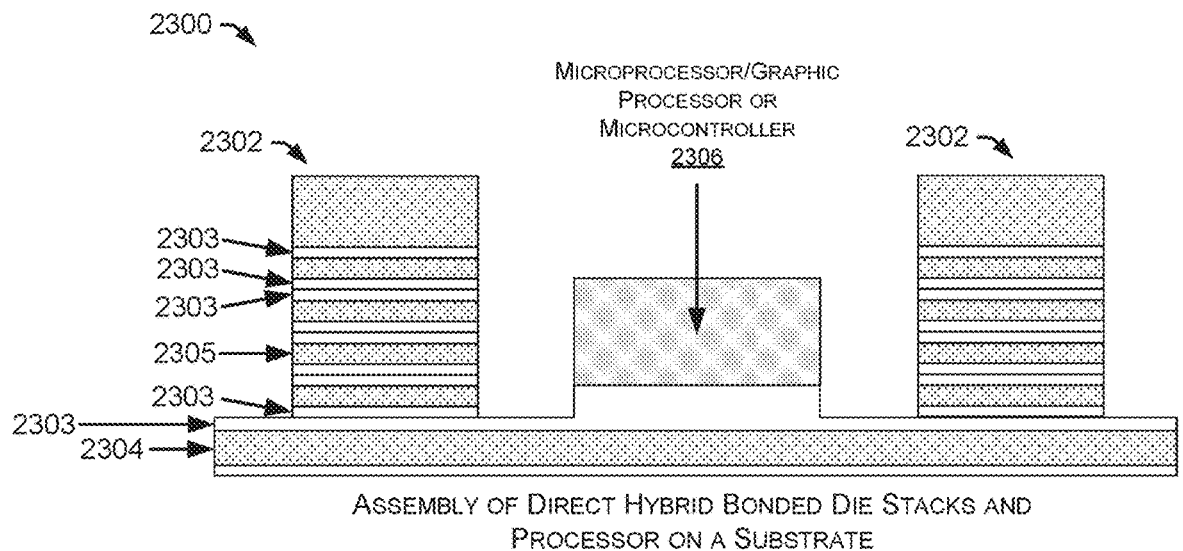
FIG. 23 is a diagram of an example structure with one or more direct bonded die stacks incorporating stress-relief measures, a processor, and optional heat sink.
Figure 23:
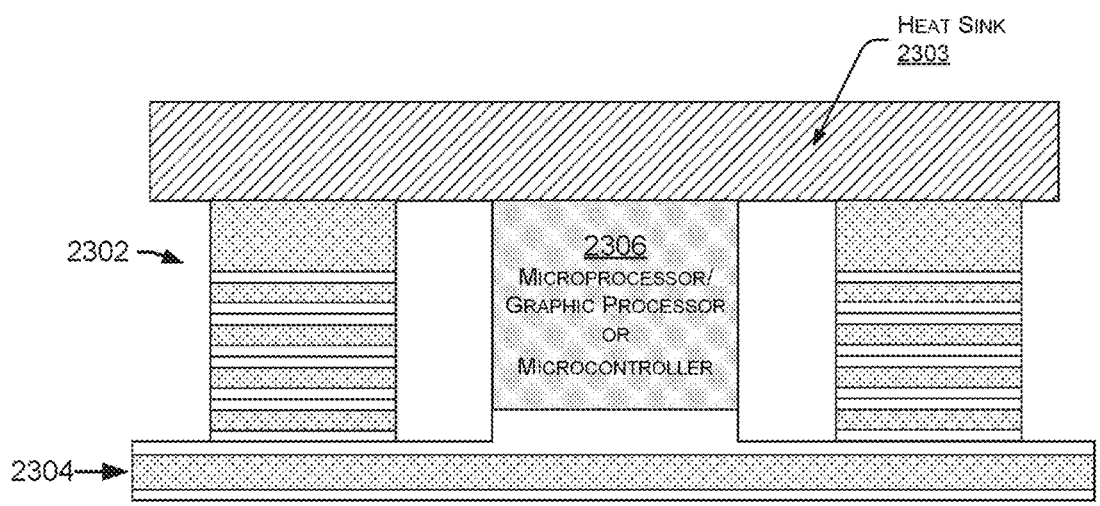

FIG. 23 shows an example module 2300 with one or more direct bonded die stacks 2302 on a substrate 2304 or board, and a microprocessor 2306 and/or graphics processor, or microcontroller, mounted on the same substrate 2304 or board. Each of the one or more direct bonded die stacks 2302 incorporates one of the described stress or warpage-relief measures or stress-warpage prevention devices of FIGS. 2-22. The microprocessor 2306 or other logic unit or processor is communicatively coupled with the one or more direct bonded die stacks 2302. Thin layers 2303 of dielectric and metal (direct hybrid bonding layer 2303) on the dies 2305 and substrate 2304 enable the direct hybrid bonding.

The bonding layer 2303 may consist of multiple layers, and/or may consist of a combination of dielectric material(s) and metal(s). The dielectric may consist of multilayer dielectrics including but not limited to diffusion barrier layers and dielectric layers for bonding which consist of Si, O, N, and C. Additionally, layer 2303 may also contain metal materials as conductive pads, wherein the direct bonding occurs at the dielectric surfaces followed by direct bonding between metal bonding pads, vias, and interconnects of the dies 2305 in an annealing step of the same overall direct bonding operation.

In an implementation, the module 2300 includes at least one heat sink 2308, and in an implementation, the one or more die stacks 2302 and the microprocessor 2306 are in contact with a common heat sink 2308.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

What is claimed is:

1. An apparatus comprising:
   a substrate;
   a die stack on the substrate, the die stack comprising a plurality of dies including:
     a first integrated device die comprising a first integrated circuit;
     a second integrated device die comprising a second integrated circuit, the first integrated device die hybrid bonded to a first bonding layer on the second integrated device die; and
     a dummy die directly bonded to a second bonding layer on an underlying die of the die stack without an intervening adhesive;
   a first lateral die support layer disposed along at least a portion of a sidewall of the first integrated device die, an entirety of the first lateral die support layer disposed laterally outside a footprint of the first integrated device die, the first lateral die support layer having a laterally outermost side surface; and
   a second lateral die support layer disposed on the substrate and adjacent the laterally outermost side surface of the first lateral die support layer, the second lateral die support layer covering an entirety of the laterally outermost side surface of the first lateral die support layer.

2. The apparatus of claim 1, wherein the dummy die comprises a top die of the die stack.

3. The apparatus of claim 1, wherein the dummy die has a greater vertical thickness than the underlying die on which the dummy die is mounted.

4. The apparatus of claim 1, wherein the dummy die has at least one horizontal dimension greater than a corresponding horizontal dimension of the underlying die on which the dummy die is mounted.

5. The apparatus of claim 1, wherein the first lateral die support layer comprises an encapsulant.

6. The apparatus of claim 5, wherein the encapsulant comprises a molding compound or underfill.

7. The apparatus of claim 1, wherein the underlying die is the first integrated device die.

8. The apparatus of claim 1, wherein an entirety of the second lateral die support layer is disposed outside the die stack.

9. The apparatus of claim 1, wherein the second lateral die support layer comprises a molding material.

10. The apparatus of claim 1, wherein at least one of the first and second integrated device dies comprises a memory module.

11. The apparatus of claim 1, wherein a thickness of each of the first and second dies is less than 55 microns.

12. An apparatus comprising:
    a die stack, the die stack comprising a plurality of dies including:
      a first integrated device die comprising a first integrated circuit;
      a second integrated device die comprising a second integrated circuit, the first integrated device die hybrid bonded to a first bonding layer on the second integrated device die; and
      a top die directly bonded to a second bonding layer on the first integrated device die without an adhesive, the top die comprising a dummy die;
    a first lateral die support layer disposed along at least a portion of a sidewall of the first integrated device die, an entirety of the first lateral die support layer disposed laterally outside a footprint of the first integrated device die; and
    a second lateral die support layer disposed laterally adjacent the top die and at least a portion of the first lateral die support layer, an entirety of the second lateral die support layer disposed outside the die stack.

13. The apparatus of claim 12, wherein the first lateral die support layer abuts a sidewall of the first integrated device die but not a sidewall of the top die.

14. The apparatus of claim 12, wherein the top die is a top-most die of the die stack.

15. The apparatus of claim 12, wherein the top die has a greater vertical thickness than each of the first and second integrated device dies.

16. The apparatus of claim 12, wherein the first lateral die support layer comprises an encapsulant that covers an entirety of the sidewall of the first integrated device die.

17. The apparatus of claim 16, wherein the encapsulant comprises a molding compound or underfill.

18. The apparatus of claim 12, wherein the second lateral die support layer comprises a molding material.

19. The apparatus of claim 12, wherein at least one of the first and second integrated device dies comprises a memory module.

20. The apparatus of claim 12, wherein the second lateral die support layer is disposed over an entirety of a laterally outermost surface of the first lateral die support layer.

21. The apparatus of claim 13, wherein the first lateral die support layer comprises one or more lateral die support structures.

* * * * *